(12) United States Patent
Watanabe et al.

(10) Patent No.: US 9,330,973 B2
(45) Date of Patent: May 3, 2016

(54) WORKPIECE PROCESSING METHOD

(71) Applicant: TOKYO ELECTRON LIMITED, Tokyo (JP)

(72) Inventors: Hikaru Watanabe, Miyagi (JP); Masanobu Honda, Miyagi (JP); Akihiro Tsuji, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/754,424

(22) Filed: Jun. 29, 2015

(65) Prior Publication Data
US 2016/0005651 A1    Jan. 7, 2016

(30) Foreign Application Priority Data

Jul. 1, 2014   (JP) .................... 2014-135629
Oct. 28, 2014  (JP) .................... 2014-219285

(51) Int. Cl.
*H01L 21/311*   (2006.01)
*H01B 13/00*    (2006.01)
*C23F 1/00*     (2006.01)
*H01L 21/768*   (2006.01)

(52) U.S. Cl.
CPC .... *H01L 21/76897* (2013.01); *H01L 21/76814* (2013.01); *H01L 21/76826* (2013.01); *H01L 21/76829* (2013.01)

(58) Field of Classification Search
CPC ............. H01L 21/76814; H01L 21/76826; H01L 21/76829; H01L 21/76897
USPC ........................... 216/18, 72; 438/702
See application file for complete search history.

(56) References Cited

U.S. PATENT DOCUMENTS

2005/0181588 A1*  8/2005  Kim ............ H01L 21/02063
                                                438/586

FOREIGN PATENT DOCUMENTS

JP           2000-307001 A     11/2000

* cited by examiner

*Primary Examiner* — Karen Kusumakar
(74) *Attorney, Agent, or Firm* — Rothwell, Figg, Ernst & Manbeck, P.C.

(57) ABSTRACT

Disclosed is a method of processing a workpiece so as to form an opening that extends from an oxide region to a base layer through a portion between the raised regions. The method includes: (1) a step of forming an opening in the oxide region to expose a second section between the raised regions; and (2) a step of etching a residue made of silicon oxide and existing within the opening and a second section. In the second step, a denatured region is formed by exposing the workpiece to plasma of a mixed gas including a hydrogen-containing gas and $NF_3$ gas to denature the residue and the second section, and the denatured region is removed.

15 Claims, 19 Drawing Sheets

WORKPIECE PROCESSING METHOD

CROSS-REFERENCE TO RELATED APPLICATIONS

This application is based on and claims priority from Japanese Patent Application Nos. 2014-135629 and 2014-219285, filed on Jul. 1, 2014 and Oct. 28, 2014, respectively, with the Japan Patent Office, the disclosures of which are incorporated herein in their entirety by reference.

TECHNICAL FIELD

The exemplary embodiments of the present disclosure relate to a workpiece processing method.

BACKGROUND

In the manufacture of an electronic device having an element such as, for example, a fin-type field effect transistor, a SAC (Self-Aligned Contact) process is used to form a contact.

A workpiece to be subjected to the SAC process includes a base layer, two raised regions, a nitride region and an oxide region. The base layer is, e.g., a polycrystalline silicon layer. The two raised regions are, e.g., gates, and are formed of polycrystalline silicon. These raised regions are provided on the base layer to be spaced apart from each other. The nitride region is made of silicon nitride and is provided so as to cover the two raised regions and the base layer. The oxide region is made of silicon oxide and is provided so as to cover the nitride region.

In the SAC process, a hole is formed in the oxide region to extend from the surface of the oxide region to the base layer via a region between the two raised regions. Generally, in the SAC process, in order to form such an opening, the oxide region is etched and the nitride region adjoining the base layer is etched using plasma of a fluorocarbon gas. Japanese Patent Laid-Open Publication No. 2000-307001 discloses such an SAC process.

SUMMARY

One aspect of the present disclosure provides a method for processing a workpiece. The workpiece includes a base layer, two raised regions provided on the base layer to be spaced apart from each other, a nitride region made of silicon nitride and including a first section covering the raised regions and a second section covering the base layer between the two raised regions, and an oxide region made of silicon oxide and covering the nitride region. The method processes the workpiece so as to form an opening that extends to the base layer through a portion between the raised regions. The method includes: (1) a step of forming an opening in the oxide region to expose the second section between the raised regions (hereinafter, referred to as a "first step"); and (2) a step of etching a residue made of silicon oxide and existing within the opening and the second section (hereinafter, referred to as a "second step"). In the second step, a denatured region is formed by exposing the workpiece to plasma of a mixed gas including a hydrogen-containing gas and $NF_3$ gas to denature the residue and the second section, and the denatured region is removed.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
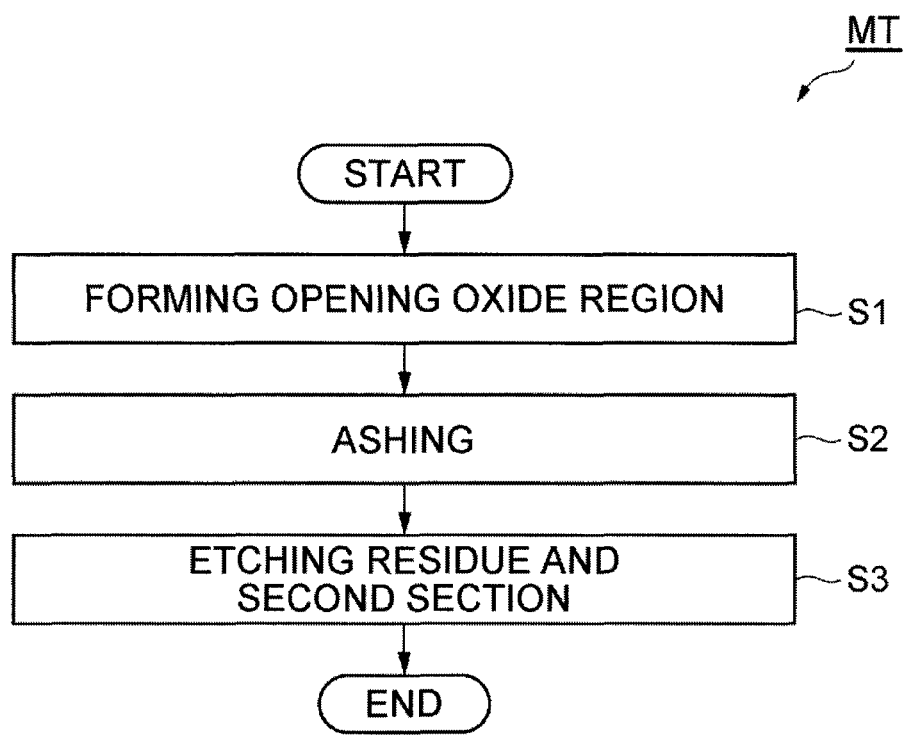
FIG. 1 is a flowchart illustrating a method of processing a workpiece according to an exemplary embodiment.

In the following detailed description, reference is made to the accompanying drawings, which form a part hereof. The illustrative embodiments described in the detailed description, drawing, and claims are not meant to be limiting. Other exemplary embodiments may be utilized, and other changes may be made' without departing from the spirit or scope of the subject matter presented here.

In the etching of the oxide region using the plasma of the fluorocarbon gas, a residue formed of silicon oxide is generated on the bottom of the hole, particularly on a boundary between a first section and a second section of the nitride region. Thus, the width of the bottom of the hole as formed becomes narrow. Even if one attempts to etch the nitride region in order to process deep the hole having such a shape, it is impossible to sufficiently etch the nitride region. Furthermore, the nitride region which covers the raised regions, particularly the shoulder portions of the first sections, is etched by active species, e.g., active species of fluorine, existing in the plasma of the fluorocarbon gas.

Accordingly, in the SAC process, it is necessary to etch the residue existing within the opening such as a hole and the nitride region existing just above the base layer, while reducing the cutting of the nitride region which covers the raised regions.

One aspect of the present disclosure provides a method for processing a workpiece. The workpiece includes a base layer, two raised regions provided on the base layer to be spaced apart from each other, a nitride region made of silicon nitride and including a first section covering the raised regions and a second section covering the base layer, and an oxide region made of silicon oxide and covering the nitride region. The method processes the workpiece so as to form an opening that extends to the base layer through a portion between the raised regions. The method includes: (1) a step of forming an opening in the oxide region to expose the second section between the raised regions (hereinafter, referred to as a "first step"); and (2) a step of etching a residue made of silicon oxide and existing within the opening and the second section (hereinafter, referred to as a "second step"). In the second step, a denatured region is formed by exposing the workpiece to plasma of a mixed gas including a hydrogen-containing gas and $NF_3$ gas to denature the residue and the second section, and the denatured region is removed.

In the method, the denatured region is formed by chemically denaturing the residue to ammonium fluorosilicate and the denatured region is removed. It is therefore possible to remove the residue existing on the bottom of the hole. Furthermore, the second section made of silicon nitride may be denatured to ammonium fluorosilicate and removed. The residue may not be removed by the plasma of the fluorocarbon gas used in the related art. Therefore, until the second section is removed, the nitride regions covering the raised regions, namely the first sections, especially the shoulder portions of the first sections, are heavily etched. However, according to the present method, since the residue is removed, the cutting of the first sections may be reduced during the removal of the second section.

In an exemplary embodiment, the mixed gas used in the second step may include $H_2$ gas and $NF_3$ gas. With this mixed gas, the residue and the second section may be simultaneously removed.

In an exemplary embodiment, the second step may include: (2a) a step of forming the denatured region by exposing the workpiece to the plasma of the mixed gas including $NH_3$ gas and $NF_3$ gas, and removing the denatured region; and (2b) a step of forming the denatured region by exposing the workpiece to the plasma of the mixed gas including $H_2$ gas and $NF_3$ gas, and removing the denatured region.

In order to denature silicon oxide to ammonium fluorosilicate, there is a need to produce ammonium fluoride from the mixed gas. In the case where the mixed gas includes $NH_3$ gas and $NF_3$ gas, ammonium fluoride can be produced by generating low dissociation plasma. Accordingly, the produced amount of active species of fluorine and hydrogen fluoride which may become a cause of the cutting of silicon nitride, and to etch silicon oxide with high selectivity with respect to silicon nitride. On the other hand, in the case where the mixed gas includes $H_2$ gas and $NF_3$ gas, ammonium fluoride can be produced by generating high dissociation plasma. In the case of using the mixed gas including $H_2$ gas and $NF_3$ gas, a relatively large amount of active species of fluorine and hydrogen fluoride are produced in the high dissociation plasma. Accordingly, it is possible to increase the etching rate of silicon nitride, although the selectivity of the etching of silicon oxide to the etching of silicon nitride decreases.

In the aforementioned exemplary embodiment, by using the mixed gas including $NH_3$ gas and $NF_3$ gas at the initial stage of removal of the residue and the second section, particularly during the removal of the residue, it is possible to suppress the cutting of the first sections during the time period in which the removal of the residue is performed. Next, by using the mixed gas including $H_2$ gas and $NF_3$ gas, it is possible to increase the etching rate of the second section. Accordingly, it becomes possible to remove the residue and the second section while further reducing the cutting of the first sections.

In an exemplary embodiment, the denatured region may be removed by heating the workpiece. Furthermore, in an exemplary embodiment, the denatured region may be removed by exposing the workpiece to secondary electrons emitted from a silicon-made upper electrode of a capacitively-coupled plasma processing apparatus. The secondary electrons are emitted when the upper electrode is sputtered by positive ions.

In an exemplary embodiment, the first step may include: (1a) a step of forming a protective film on the nitride region and the oxide region (hereinafter referred to as a "third step"), at which step a protective film larger in thickness than a protective film formed on the oxide region is formed on the nitride region by exposing the workpiece to plasma of a fluorocarbon gas; and (1b) a step of etching the oxide region (hereinafter referred to as a "fourth step"), at which step the workpiece is exposed to plasma of a fluorocarbon gas. In the present exemplary embodiment, the high-frequency bias power supplied to a mounting table configured to mounts the workpiece thereon at the third step is smaller than the high-frequency bias power supplied to the mounting table at the fourth step. At the third step, the workpiece is set at a temperature in a range of 60° C. to 250° C. In an exemplary embodiment, the third step and the fourth step may be alternately repeated. Furthermore, in an exemplary embodiment, the high-frequency bias power may not be supplied to the mounting table at the third step. Moreover, in an exemplary embodiment, a gas including at least one of $C_4F_6$, $C_4F_8$, and $C_6F_6$ may be used as the fluorocarbon gas at the third step.

Under the temperature environment in a range of 60° C. to 250° C., the thickness of the protective film of fluorocarbon formed on the nitride region becomes larger than the thickness of the protective film formed on the oxide region. Furthermore, when the relatively low bias power is supplied, the etching rate of the nitride region decreases. Therefore, according to the aforementioned exemplary embodiment, it is possible to form a thick protective film on the nitride region at the third step. When selectively etching the oxide region at the fourth step, it becomes possible to suppress the etching of the nitride region.

In an exemplary embodiment, the first step may include: (1c) a step of exposing the workpiece to plasma of a processing gas including a fluorocarbon gas (hereinafter referred to as a "fifth step"), at which step the oxide region is etched and a deposition including fluorocarbon is formed on the oxide region; and (1d) a step of etching the oxide region by radicals of the fluorocarbon included in the deposition (hereinafter referred to as a "sixth step"). In the present exemplary embodiment, the fifth step and the sixth step are alternately repeated.

In the present exemplary embodiment, the oxide region is etched by the plasma of the fluorocarbon gas generated at the fifth step. A deposition is formed on the oxide region. Then, at the sixth step, the oxide region is further etched by the radicals of fluorocarbon included in the deposition. Furthermore, at the sixth step, the amount of the deposition is reduced. Thus, the oxide region is further etched by performing the fifth step again. By alternately repeating the fifth step and the sixth step, it becomes possible to prevent the stop of the etching of the oxide region, namely a silicon oxide film. As a result, it becomes possible to continuously perform the etching of the oxide region.

In an exemplary embodiment, at the sixth step, the workpiece may be exposed to plasma of a rare gas. In the present exemplary embodiment, ions of rare gas atoms collide with the deposition so that the fluorocarbon radicals existing in the deposition etches the oxide region. At the sixth step of an exemplary embodiment, the fluorocarbon gas may not be substantially supplied.

The method of an exemplary embodiment may further include a step of forming an additional protective film on the first sections and the second section. The step of forming the additional protective film is executed between the first step and the second step. At the step of forming the additional protective film, the plasma processing of the fluorocarbon gas may be executed. That is, the additional protective film may be a protective film including fluorocarbon. The amount of the molecules contributed to the formation of the protective film becomes larger in the vicinity of the top portions of raised regions and becomes smaller in the deep portion of an opening formed in the oxide region. Accordingly, the thickness of the protective film grows larger in the vicinity of the top portions of the raised regions and grows smaller in the vicinity of the deep portion of the opening. Accordingly, it becomes possible to etch the residue and the second section while further suppressing the cutting of the first sections.

The method of an exemplary embodiment may further include a step of executing an ashing process for removing an organic substance existing on the workpiece in which the opening is formed. The step of forming the additional protective film may be executed between the step of executing the ashing process and the second step.

As described above, in the SAC process, it is possible to etch the residue existing within the opening such as a hole and the nitride region existing just above the base layer, while reducing the cutting of the nitride region which covers the raised regions.

Hereinafter, various exemplary embodiments of the present disclosure will be described in detail with reference to the accompanying drawings. Throughout the drawings, identical or equivalent parts will be designated by like reference numerals.

FIG. 1 is a flowchart illustrating a workpiece processing method according to an exemplary embodiment. The method MT illustrated in FIG. 1 is a method for forming an opening in a workpiece (hereinafter, referred to as a "wafer W"). In an example, the method MT may be used to form an opening such as, for example, a hole in a workpiece illustrated in FIG. 2.

Figure 2:
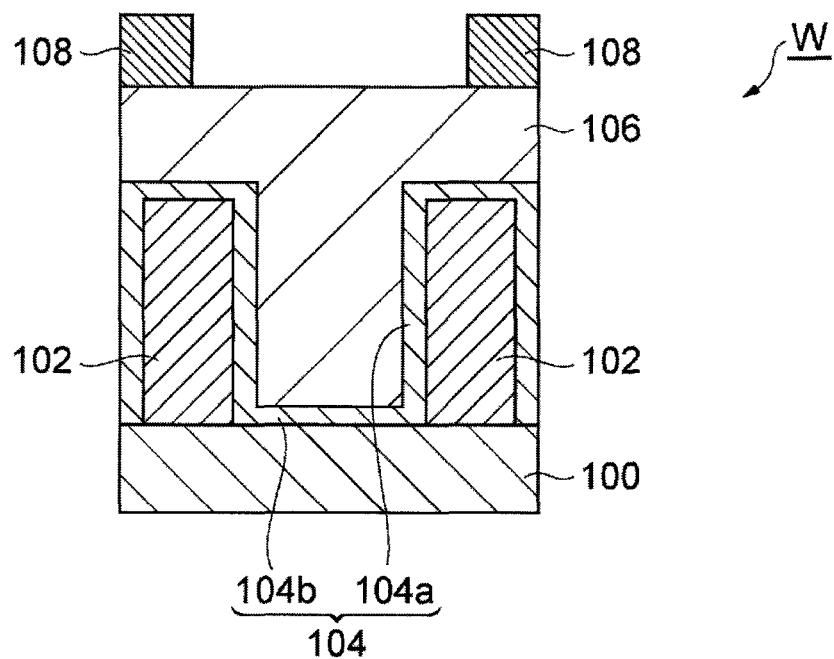
FIG. 2 is a sectional view illustrating an exemplary workpiece.

FIG. 2 is a sectional view illustrating an exemplary workpiece. The wafer W illustrated in FIG. 2 includes a base layer 100, a plurality of raised regions 102, a nitride region 104, an oxide region 106, and a mask 108. The wafer W may be a product obtained during the manufacture of, e.g., a fin-type field effect transistor.

The base layer 100 may be formed of, e.g., polycrystalline silicon. In an example, the base layer 100 is a fin region of a fin-type field effect transistor provided on a substrate. The base layer 100 has a shape defined by a pair of side surfaces and a top surface extending between the top ends of the side surfaces. In an example, the base layer 100 may have a substantially rectangular parallelepiped shape.

The raised regions 102 are provided to protrude upward from the base layer 100. The raised regions 102 are provided on the base layer 100 to be spaced apart from each other. For example, the raised regions 102 are spaced apart from each other and arranged in parallel with each other. In an example, the raised regions 102 are gate regions of the fin-type field effect transistor and may be made of polycrystalline silicon. In the present example, the raised regions 102 extend in a direction orthogonal to the extension direction of the base layer 100 serving as a fin region. Each of the raised regions 102 has a shape defined by a pair of side surfaces and a top surface extending between the top ends of the side surfaces. For example, each of the raised regions 102 may have a substantially rectangular parallelepiped shape. The number of the raised regions 102 may be an arbitrary number of two or more.

The nitride region 104 is formed of silicon nitride and includes first sections 104a and a second section 104b. The first sections 104a are provided so as to cover the raised regions 102. The first sections 104a are in contact with the surfaces of the raised regions 102. Furthermore, the second section 104b is continuous with the first sections 104a and is provided between the adjacent raised regions 102 on the base layer 100.

The oxide region 106 is formed of silicon oxide. The oxide region 106 is provided so as to cover the nitride region 104. That is, the oxide region 106 is embedded between the adjacent raised regions 102 so as to cover the nitride region 104. The oxide region 106 provides a substantially flat surface above the raised regions 102 and the nitride region 104. In an example, the oxide region 106 may be an inter-layer insulation layer of a fin-type field effect transistor.

The mask 108 is provided on the oxide region 106. The mask 108 has a pattern opened at the upper side of the gap between the adjacent raised regions 102. The mask 108 is formed of an organic film. Moreover, the mask 108 may be fabricated by photolithography.

The method MT is used to form an opening extending from the top surface of the oxide region 106 to the top surface of the base layer 100 between the adjacent raised regions 102. That is, the method MT is used to form an opening, e.g., a hole, between the adjacent raised regions 102 in a self-aligned manner. Hereinafter, descriptions will be made assuming that the opening formed in the wafer W is a hole. In an example, the hole may be a hole for a contact connected to a source or a drain of a fin region.

Figure 3:
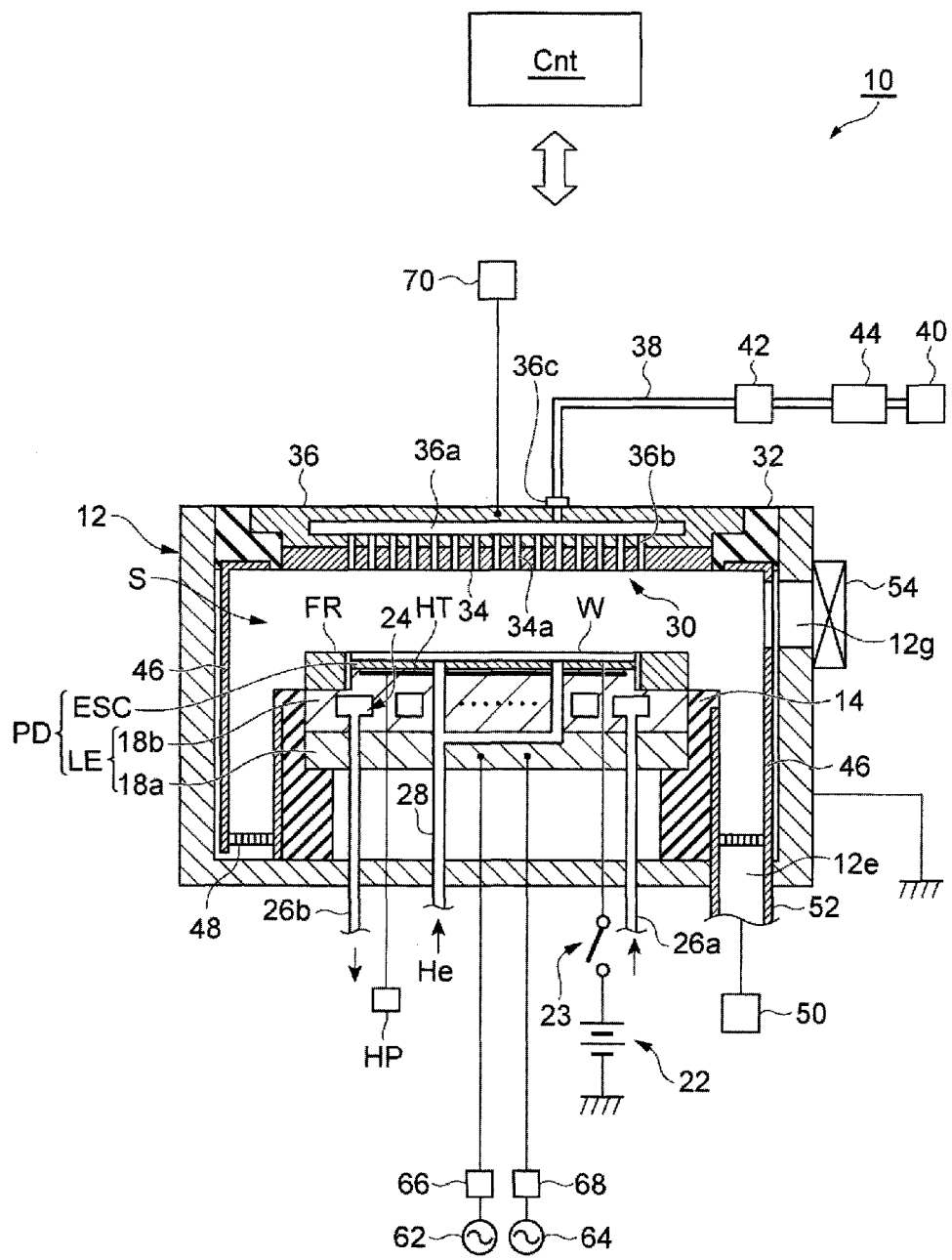
FIG. 3 is a view schematically illustrating a plasma processing apparatus according to an exemplary embodiment.

Hereinafter, descriptions will be made on a plasma processing apparatus which may be used for implementing the method MT. FIG. 3 is a view schematically illustrating a plasma processing apparatus according to an exemplary embodiment. The plasma processing apparatus 10 illustrated in FIG. 3 is a capacitively-coupled plasma etching apparatus and is provided with a processing container 12. The processing container 12 has a substantially cylindrical shape. The processing container 12 is made of, e.g., aluminum. The inner wall surface of the processing container 12 is subjected to anodizing. The processing container 12 is grounded for safety.

A substantially cylindrical support 14 is provided on the bottom portion of the processing container 12. The support 14 is made of, e.g., an insulating material. Within the processing container 12, the support 14 extends from the bottom portion of the processing container 12 in the vertical direction. Furthermore, a mounting table PD is provided within the processing container 12. The mounting table PD is supported by the support 14.

The mounting table PD holds the wafer W on the top surface thereof. The mounting table PD includes a lower electrode LE and an electrostatic chuck ESC. The lower electrode LE includes a first plate 18a and a second plate 18b. The first plate 18a and the second plate 18b are made of a metal such as, for example, aluminum, and are formed in a substantially disc-like shape. The second plate 18b is provided on the first plate 18a and is electrically connected to the first plate 18a.

The electrostatic chuck ESC is provided on the second plate 18b. The electrostatic chuck ESC has a structure in which an electrode as an electrically conductive film is disposed between a pair of insulation layers or insulation sheets. A DC power source 22 is electrically connected to the electrode of the electrostatic chuck ESC via a switch 23. The electrostatic chuck ESC attracts a wafer W with an electrostatic force such as, for example, a Coulomb force generated by a DC voltage supplied from the DC power source 22. Thus, the electrostatic chuck ESC can hold the wafer W.

A focus ring FR is disposed on the peripheral edge portion of the second plate 18b to surround the edge of the wafer W and the electrostatic chuck ESC. The focus ring FR is provided to improve the uniformity of etching. The focus ring FR is made of a material appropriately selected depending on the material of an etching target film. The focus ring FR may be made of, e.g., quartz.

A coolant flow path 24 is provided within the second plate 18b. The coolant flow path 24 constitutes a temperature adjustment mechanism. A coolant is supplied from a chiller unit, which is provided outside the processing container 12, to the coolant flow path 24 through a pipe 26a. The coolant supplied to the coolant flow path 24 is returned to the chiller unit through a pipe 26b. In this way, the coolant is supplied to the coolant flow path 24 so as to circulate therethrough. The temperature of the wafer W supported by the electrostatic chuck ESC is controlled by controlling the temperature of the coolant.

Furthermore, a gas supply line 28 is provided in the plasma processing apparatus 10. The gas supply line 28 supplies a heat transfer gas, e.g., He gas, which is fed from a heat transfer gas supply mechanism, to a gap between the top surface of the electrostatic chuck ESC and the rear surface of the wafer W.

Furthermore, a heater HT as a heating element is provided in the plasma processing apparatus 10. The heater HT is embedded within, e.g., the second plate 18b. A heater power source HP is connected to the heater HT. Electric power is supplied from the heater power source HP to the heater HT so as to control the temperature of the mounting table PD and the temperature of the wafer W disposed on the mounting table PD. Alternatively, the heater HT may be installed within the electrostatic chuck ESC.

The plasma processing apparatus 10 further includes an upper electrode 30. The upper electrode 30 is disposed above the mounting table PD to face the mounting table PD. The lower electrode LE and the upper electrode 30 are provided to be substantially parallel with each other. A processing space S for performing a plasma processing on the wafer W is provided between the upper electrode 30 and the lower electrode LE.

The upper electrode 30 is supported on the upper portion of the processing container 12 through an insulating shield member 32. In an exemplary embodiment, the upper electrode 30 may be configured such that the vertical distance from the top surface, i.e., the wafer mounting surface, of the mounting table PD to the upper electrode 30 is variable. The upper electrode 30 may include an electrode plate 34 and an electrode support body 36. The electrode plate 34 adjoins the processing space S. A plurality of gas ejection holes 34a is formed in the electrode plate 34. In an exemplary embodiment, the electrode plate 34 is made of silicon.

The electrode support body 36 is configured to removably support the electrode plate 34 and may be made of, e.g., an electrically conductive material such as, for example, aluminum. The electrode support body 36 may have a water cooling structure. A gas diffusion chamber 36a is provided within the electrode support body 36. A plurality of gas flow holes 36b communicating with the gas ejection holes 34a extends downward from the gas diffusion chamber 36a. A gas introduction port 36c is formed in the electrode support body 36 so as to guide a processing gas to the gas diffusion chamber 36a. A gas supply pipe 38 is connected to the gas introduction port 36c.

A gas source group 40 is connected to the gas supply pipe 38 via a valve group 42 and a flow rate controller group 44. The gas source group 40 includes a plurality of gas sources. The gas sources may include a source of fluorocarbon gas, a source of oxygen gas ($O_2$ gas), a source of a rare gas, a source of an inert gas, a source of $NF_3$ gas, and a source of hydrogen gas ($H_2$ gas). The inert gas may be nitrogen gas ($N_2$ gas). The rare gas may be an arbitrary rare gas such as, for example, Ar gas or He gas. The fluorocarbon gas may be a gas containing at least one of $C_4F_6$, $C_4F_8$, and $C_6F_6$.

The valve group 42 includes a plurality of valves. The flow rate controller group 44 includes a plurality of flow rate controllers such as, for example, mass flow controllers. The gas sources of the gas source group 40 are respectively connected to the gas supply pipe 38 via the corresponding valves of the valve group 42 and the corresponding flow rate controllers of the flow rate controller group 44.

In the plasma processing apparatus 10, a deposition shield 46 is removably provided along the inner wall of the processing container 12. The deposition shield 46 is also provided on the outer periphery of the support 14. The deposition shield 46 is configured to prevent an etching byproduct (deposition) from adhering to the processing container 12 and may be formed by coating ceramics such as, for example, $Y_2O_3$, on an aluminum material.

An exhaust plate 48 is provided at the bottom portion side of the processing container 12 and between the support 14 and the sidewall of the processing container 12. The exhaust plate 48 may be formed by coating ceramics such as, for example, $Y_2O_3$ on an aluminum material. An exhaust port 12e is formed in the processing container 12 at the lower side of the exhaust plate 48. An exhaust device 50 is connected to the exhaust port 12e via an exhaust pipe 52. The exhaust device 50 includes a vacuum pump such as, for example, a turbo molecular pump, and can depressurize the internal space of the processing container 12 to a desired vacuum degree. A wafer carry-in/out gate 12g is formed in the sidewall of the processing container 12. The carry-in/out gate 12g is configured to be opened/closed by a gate valve 54.

The plasma processing apparatus 10 further includes a first high-frequency power source 62 and a second high-frequency power source 64. The first high-frequency power source 62 is a power source which generates first high-frequency power for plasma generation. The first high-frequency power source 62 generates high-frequency power having a frequency of 27 to 100 MHz, e.g., 40 MHz. The first high-frequency power source 62 is connected to the lower electrode LE via a matcher 66. The matcher 66 is a circuit for matching the output impedance of the first high-frequency power source 62 with the input impedance of a load (the lower electrode LE).

The second high-frequency power source 64 is a power source that generates second high-frequency power, i.e., high-frequency bias power, for drawing ions into the wafer W. The second high-frequency power source 64 generates a high-frequency bias power having a frequency within a range of 400 kHz to 13.56 MHz, e.g., 13 MHz. The second high-frequency power source 64 is connected to the lower electrode LE via a matcher 68. The matcher 68 is a circuit for matching the output impedance of the second high-frequency power source 64 with the input impedance of a load (the lower electrode LE).

The plasma processing apparatus 10 further includes a power source 70. The power source 70 is connected to the upper electrode 30. The power source 70 applies a voltage for drawing positive ions existing within the processing space S into the electrode plate 34, to the upper electrode 30. In an example, the power source 70 is a DC power source that generates a negative DC voltage. In another example, the power source 70 may be an AC power source that generates an AC voltage having a relatively low frequency. The voltage applied from the power source 70 to the upper electrode 30 may be a voltage of −150 V or less. That is, the voltage applied to the upper electrode 30 by the power source 70 may be a negative voltage having an absolute value of 150 V or more. When such a voltage is applied from the power source 70 to the upper electrode 30, the positive ions existing in the processing space S collide with the electrode plate 34. Thus, secondary electrons and/or silicon are emitted from the electrode plate 34.

In an exemplary embodiment, the plasma processing apparatus 10 may further include a control unit Cnt. The control unit Cnt is a computer which includes a processor, a storage unit, an input device, a display device, and so forth. The control unit Cnt controls the respective parts of the plasma processing apparatus 10. Specifically, the control unit Cnt is connected to the valve group 42, the flow rate controller group 44, the exhaust device 50, the first high-frequency power source 62, the matcher 66, the second high-frequency power source 64, the matcher 68, the power source 70, the heater power source HP and the chiller unit.

The control unit Cnt operates according to a program based on an input recipe and sends control signals. The selection and the flow rate of the gases supplied from the gas source group, the exhaust of the exhaust device 50, the power supply from the first high-frequency power source 62 and the second high-frequency power source 64, the voltage application from the power source 70, the power supply from the heater power source HP, and the flow rate and the temperature of the coolant supplied from the chiller unit can be controlled by the control signals sent from the control unit Cnt.

Figure 4:
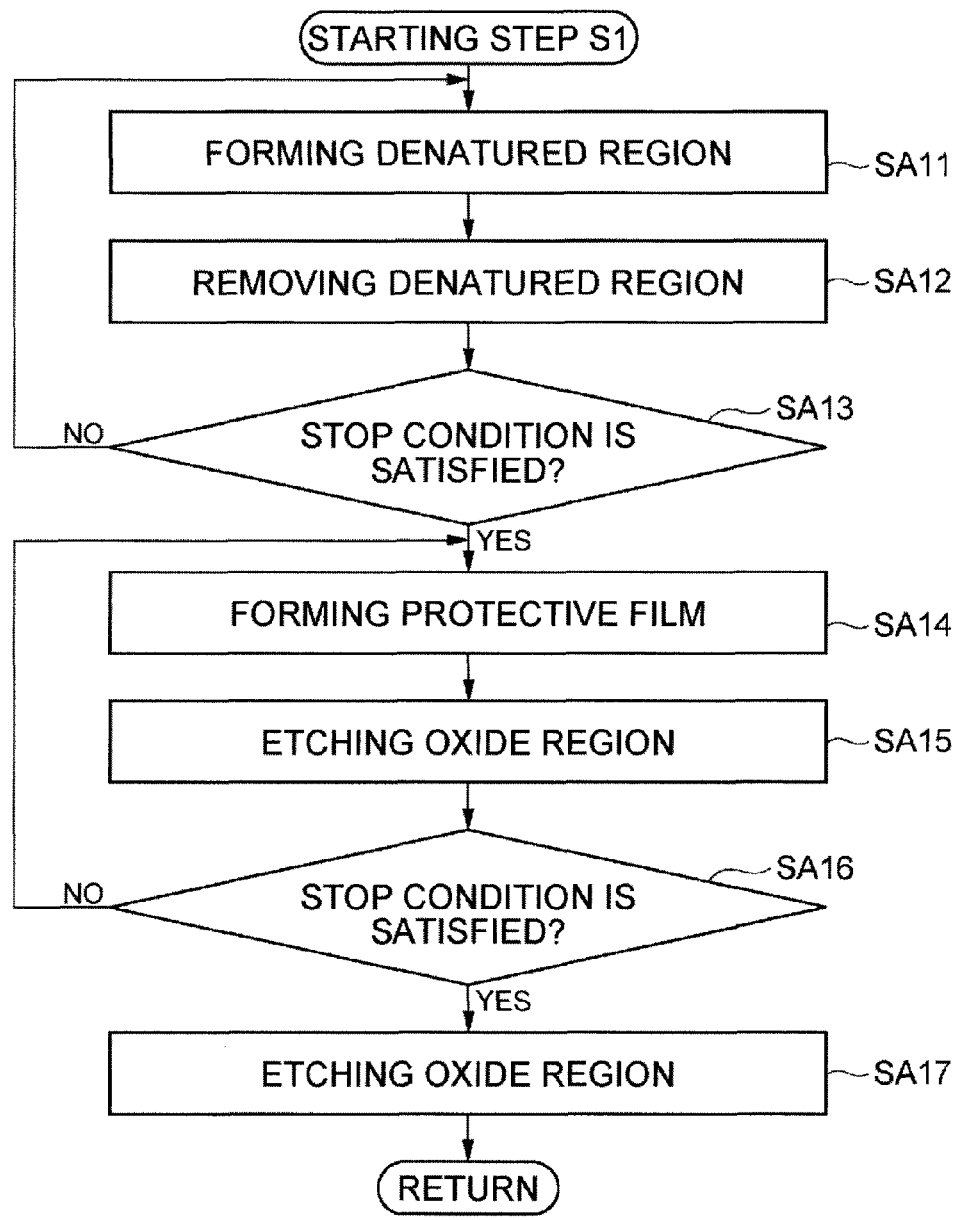
FIG. 4 is a flowchart illustrating an exemplary embodiment of step S1 illustrated in FIG. 1.

Referring again to FIG. 1, the respective steps of the method MT will be described in detail together with various kinds of control of the control unit Cnt. As illustrated in FIG. 1, in the method MT, step S1 is first executed. At step S1, an opening for exposing the second section 104b in between the adjacent raised regions 102 is formed in the oxide region 106. FIG. 4 is a flowchart illustrating an exemplary embodiment of step S1 illustrated in FIG. 1. Hereinafter, reference will be made to FIGS. 5, 6 and 7 together with FIG. 4. FIGS. 5, 6 and 7 are views illustrating the cross sections of a workpiece related to the respective steps illustrated in FIG. 4.

Figure 5A:
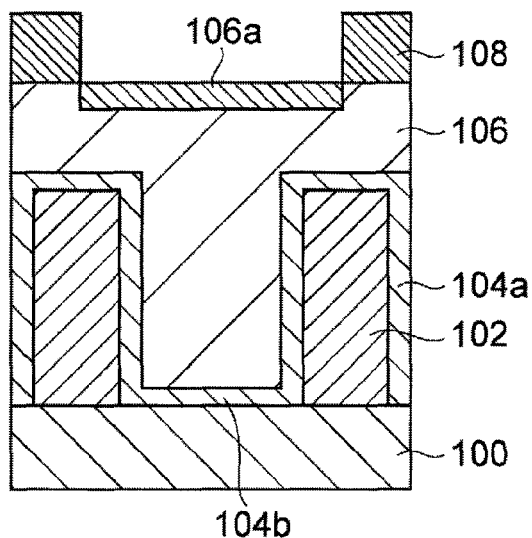
FIGS. 5A to 5C are views illustrating the cross sections of a workpiece related to the respective steps illustrated in FIG. 4.

As illustrated in FIG. 4, step S1 of an exemplary embodiment includes steps SA11 to SA17. At step SA11, a denatured region is formed by denaturing the oxide region 106 of the wafer W illustrated in FIG. 2. Specifically, at step SA11, the wafer W is exposed to the plasma of a first gas. The first gas contains hydrogen, nitrogen, and fluorine. For example, the first gas may be a mixed gas of $H_2$ gas, $N_2$ gas, and $NF_3$ gas, or a mixed gas of $NH_3$ gas and $NF_3$ gas. Furthermore, the first gas may include a rare gas such as, for example, an Ar gas. When the wafer W is exposed to the plasma of the first gas, silicon oxide constituting the oxide region 106 is denatured to ammonium fluorosilicate (($NH_4)_2SiF_6$). Thus, as illustrated in FIG. 5A, at least a portion of the oxide region 106 is denatured to a denatured region 106a.

In the case where step SA11 is performed using the plasma processing apparatus 10, the control unit Cnt controls the valve group 42 and the flow rate controller group 44 so that the first gas is supplied from the gas source group 40. Furthermore, the control unit Cnt controls the first high-frequency power source 62 so as to supply a high-frequency power to the lower electrode LE in order to excite the first gas.

At step SA11, the internal pressure of the processing container 12 is set at a pressure of, e.g., 400 mTorr to 600 mTorr (53.33 Pa to 79.99 Pa). Moreover, the high-frequency power supplied from the first high-frequency power source 62 is set at an electric power of, e.g., 800 W to 1,200 W. At step SA11, the high-frequency bias power may not be supplied from the second high-frequency power source 64. In the case where a mixed gas of $H_2$ gas, $N_2$ gas, and $NF_3$ gas is used as the first gas, the partial pressures of $NF_3$ gas and $H_2$ gas in the mixed gas are controlled to be within a range of 1:2 to 1:10, e.g., 1:2.5. Moreover, the temperature of the wafer W is controlled at a temperature of 60° C. or less, e.g., at a temperature of 0° C. For this purpose, the control unit Cnt may adjust the temperature of the mounting table PD by controlling the heater power source HP of the plasma processing apparatus 10. The processing time at step SA11 may be set at 30 seconds to 60 seconds.

Subsequently, step SA12 is performed at step S1 of an exemplary embodiment. At step SA12, the denatured region 106a is removed. In an example, the denatured region 106a is removed by heating the wafer W. In this example, the wafer W may be heated to a temperature in a range of, e.g., 60° C. to 250° C. In the case where the wafer W is heated in the plasma processing apparatus 10, the control unit Cnt adjusts the temperature of the mounting table PD by controlling the heater power source HP. Thus, the wafer W is heated. At step SA12, the wafer W may be heated using a heat treatment apparatus other than the plasma processing apparatus 10.

In another example of step SA12, the denatured region 106a is removed by irradiating secondary electrons on the wafer W. In the case where step SA12 of this example is executed using the plasma processing apparatus 10, an inert gas or a rare gas is supplied from the gas source group 40 into the processing container 12. The internal pressure of the processing container 12 is reduced to a preset value by the exhaust device 50. The gas used at step SA12 is a gas which can be excited to generate positive ions. Accordingly, $H_2$ gas may be used at step SA12. At step SA12 of this example, a voltage is applied from the power source 70 to the upper electrode 30 of the plasma processing apparatus 10. Moreover, at step SA12 of this example, a high-frequency power is supplied from the first high-frequency power source 62 to the lower electrode LE in order to excite the gas. Thus, positive ions are generated within the processing container 12. In addition, at step SA12 of this example, if necessary, a high-frequency bias power may be supplied from the second high-frequency power source 64 to the lower electrode LE.

At step SA12 where the secondary electrons are used, the internal pressure of the processing container 12 is set at a pressure of, e.g., 40 mTorr to 60 mTorr (5.33 Pa to 7.99 Pa).

The high-frequency power supplied from the first high-frequency power source 62 is set at an electric power of, e.g., 200 W to 400 W. Moreover, the high-frequency bias power may not be supplied from the second high-frequency power source 64. The voltage applied from the power source 70 to the upper electrode 30 of the plasma processing apparatus 10 may be a negative DC voltage having an absolute value of 1,000 V. The absolute value of the negative DC voltage applied to the upper electrode 30 at step SA12 may be at least 500 V or higher and may be set at an absolute value within a range of, e.g., 800 V to 1,200 V. In the case where Ar gas is supplied as the rare gas, the flow rate of the Ar gas may be set at a flow rate in a range of 300 sccm to 500 sccm. The temperature of the wafer W is controlled at a temperature of 60° C. or less, e.g., 40° C. The processing time may be set at 20 seconds to 40 seconds.

Figure 5B:
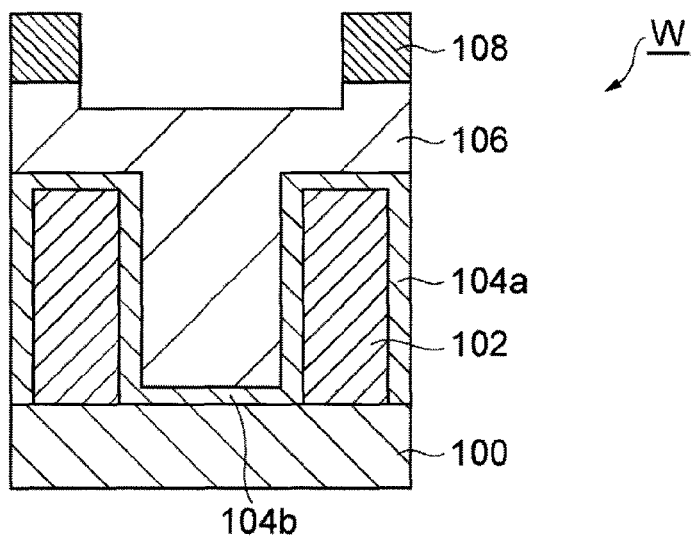

According to step SA12 of these examples, the ammonium fluorosilicate of the denatured region 106a is sublimated. As a result, the denatured region 106a is removed as illustrated in FIG. 5B.

Figure 5C:
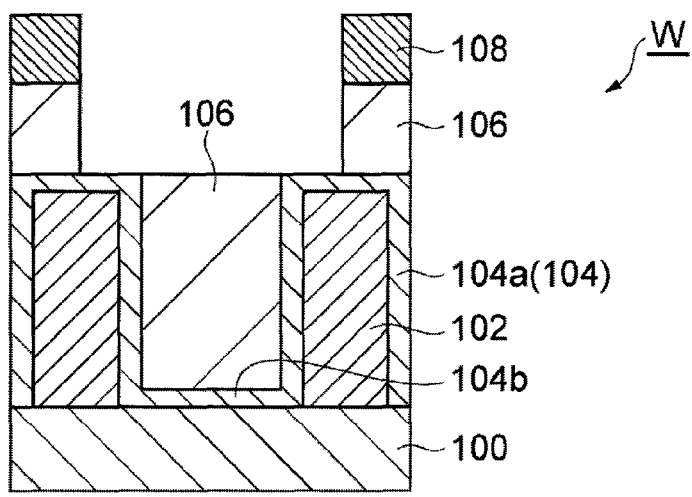

Step SA11 and step SA12 are alternately executed a predetermined number of times (e.g., seven times) until the top surface of the nitride region 104 is exposed. At step SA13, determination is made as to whether the number of repetition of step SA11 and step SA12 satisfies a stop condition. That is, at step SA13, determination is made as to whether step SA11 and step SA12 have been executed a predetermined number of times. If the stop condition is not satisfied, step SA11 and step SA12 are repeated again. On the other hand, if the stop condition is satisfied, the process proceeds to step SA14. As a result of such repetition of step SA11 and step SA12, as illustrated in FIG. 5C, the oxide region 106 is partially removed and the top surface of the nitride region 104, namely the top surfaces of the first sections 104a, is exposed. In the processing of step SA11 and step SA12, it is possible to remove the oxide region 106 at a relatively high selection ratio with respect to the nitride region 104. It is therefore possible to suppress damage of the nitride region 104.

Subsequently, step SA14 is executed at step S1. At step SA14, a protective film is formed on the nitride region 104 and the oxide region 106. At step SA14, the formation of the protective film is controlled such that the thickness of the protective film formed on the nitride region 104 becomes larger than the thickness of the protective film formed on the oxide region 106.

Specifically, at step SA14, the wafer W is exposed to the plasma of a second gas. The second gas is a gas including fluorocarbon gas. The fluorocarbon gas may be a gas containing at least one of $C_4F_6$, $C_4F_8$, and $C_6F_6$. The second gas may further include a rare gas such as, for example, Ar gas, and $O_2$ gas. At step SA14, the high-frequency bias power supplied to the lower electrode LE is controlled to become smaller than the high-frequency bias power supplied to the lower electrode LE at step SA15 which will be described later. For example, at step SA14, the high-frequency bias power may not be supplied to the lower electrode LE. As a result, the etching rate of the nitride region 104 is reduced and the nitride region 104 is not substantially etched.

Figure 6A:
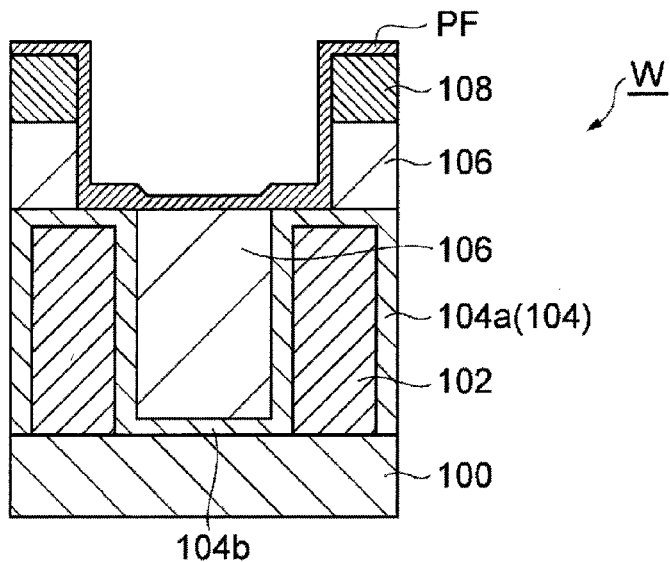
FIGS. 6A to 6C are views illustrating the cross sections of the workpiece related to the respective steps illustrated in FIG. 4.

At step SA14, the temperature of the wafer W is set at a temperature of 60° C. or higher and 250° C. or lower. Thus, as illustrated in FIG. 6A, a fluorocarbon-based protective film PF is formed on the nitride region 104 and the oxide region 106. The thickness of the protective film PF formed on the nitride region 104 becomes larger than the thickness of the protective film PF formed on the oxide region 106. In the temperature region exceeding 250° C., the temperature of the wafer W becomes equal to the glass transition temperature of the mask 108. At this temperature, the difference between the thickness of the protective film formed on the oxide region 106 and the thickness of the protective film formed on the nitride region 104 becomes small. Even at the temperature lower than 60° C., the difference between the thickness of the protective film formed on the oxide region 106 and the thickness of the protective film formed on the nitride region 104 becomes small.

In the case where step SA14 is performed using the plasma processing apparatus 10, the control unit Cnt controls the valve group 42 and the flow rate controller group 44 so as to supply the second gas from the gas source group 40. Furthermore, the control unit Cnt controls the first high-frequency power source 62 so as to supply a high-frequency power to the lower electrode LE. Furthermore, the control unit Cnt controls the second high-frequency power source 64 so that the high-frequency bias power becomes low power, for example, so that the high-frequency bias power is not supplied. Furthermore, the control unit Cnt controls the heater power source HP of the plasma processing apparatus 10 to adjust the temperature of the mounting table PD, thereby adjusting the temperature of the wafer W.

For example, at step SA14, the internal pressure of the processing container 12 is set at a pressure of 10 mTorr to 30 mTorr (1.333 Pa to 4 Pa). Furthermore, at step SA14, a high-frequency power of 60 MHz and 500 W to 2,000 W is supplied from the first high-frequency power source 62 to the lower electrode LE. Moreover, the flow rates of the $C_4F_6$ gas, the Ar gas, and the $O_2$ gas included in the second gas are set at a flow rate of 15 sccm to 25 sccm, a flow rate of 500 sccm to 600 sccm, and a flow rate of 10 sccm to 20 sccm, respectively. In addition, the processing time at step SA14 may be 10 seconds to 20 seconds.

Subsequently, step SA15 is executed at step S1. At step SA15, the oxide region 106 is etched. In this example, the oxide region 106 existing between the adjacent raised regions 102 is etched.

Figure 6B:
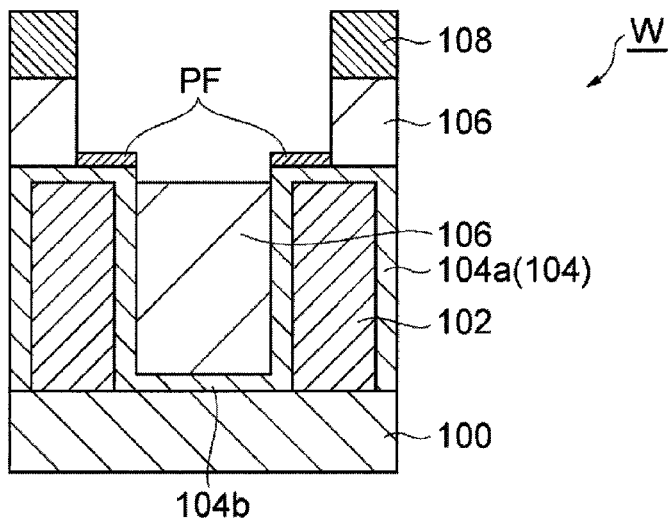

Specifically, at step SA15, the wafer W is exposed to the plasma of a third gas. The third gas is a gas including fluorocarbon gas. The fluorocarbon gas may be a gas containing at least one of $C_4F_6$, $C_4F_8$, and $C_6F_6$. The third gas may further include a rare gas such as, for example, Ar gas, and $O_2$ gas. At step SA15, a relatively high high-frequency bias power is supplied to the lower electrode LE. Thus, the oxide region 106 on which a relatively high protective film PF is formed is etched as illustrated in FIG. 6B.

In the case where step SA15 is performed using the plasma processing apparatus 10, the control unit Cnt controls the valve group 42 and the flow rate controller group 44 so as to supply the third gas from the gas source group 40. Furthermore, the control unit Cnt controls the first high-frequency power source 62 so as to supply a high-frequency power to the lower electrode LE. Moreover, the control unit Cnt controls the second high-frequency power source 64 so as to supply a high-frequency bias power to the lower electrode LE.

For example, at step SA15, the internal pressure of the processing container 12 is set at a pressure of 10 mTorr to 30 mTorr (1.333 Pa to 4 Pa). Furthermore, at step SA15, a high-frequency power of 60 MHz and 500 W to 2,000 W is supplied from the first high-frequency power source 62 to the lower electrode LE. Moreover, at step SA15, a high-frequency bias power of 1,000 W to 2,000 W is supplied from the second high-frequency power source 64 to the lower electrode LE. The flow rates of the $C_4F_6$ gas, the Ar gas, and the $O_2$ gas included in the third gas are set at a flow rate of 15 sccm to 25 sccm, a flow rate of 500 sccm to 600 sccm, and a flow rate of 10 sccm to 20 sccm, respectively. In addition, the processing time at step SA15 may be 10 seconds to 30 seconds. The temperature of the wafer W at step SA15 may be equal to or lower than the temperature of the wafer W at step SA14.

Figure 6C:
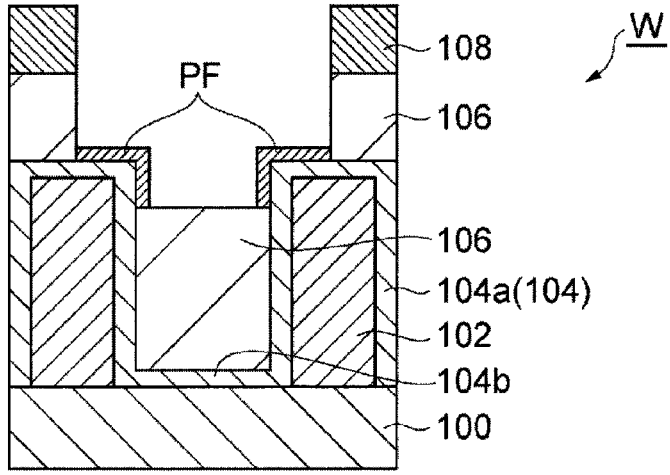

Step SA14 and step SA15 are alternately executed a predetermined number of times. At step SA16, determination is made as to whether the number of repetition of step SA14 and step SA15 satisfies a stop condition. That is, at step SA16, determination is made as to whether step SA14 and step SA15 have been executed a predetermined number of times. When the stop condition is not satisfied, step SA14 and step SA15 are repeated again. On the other hand, when the stop condition is satisfied, the execution of step SA14 and step SA15 is terminated. By alternately executing step SA14 and step SA15 a predetermined number of times in this way, the oxide region 106 existing between the adjacent raised regions 102 is etched at a specified depth as illustrated in FIG. 6C. In FIG. 6C, the etching of the oxide region 106 does not reach the top surface of the second section 104b of the nitride region 104. However, step SA14 and step SA15 may be executed until the etching of the oxide region 106 reaches the top surface of the second section 104b.

According to these steps SA14 and SA15, it becomes possible to, just after the exposure, etch the oxide region 106 while suppressing the cutting of the nitride region 104 on which the protective film is not formed. Even if step SA14 and step SA15 are executed a predetermined number of times, the protective film PF is maintained on the nitride region 104. In the etching performed using the gas which contains fluorocarbon, the forming of the protective film on the oxide region 106 and the etching of the oxide region 106 are simultaneously performed. Accordingly, the oxide region 106 may be further etched by executing the same etching as that of step SA15 after step SA14 and step SA15 are executed a predetermined number of times. This makes it possible to increase the etching rate of the oxide region 106.

Figure 7A:
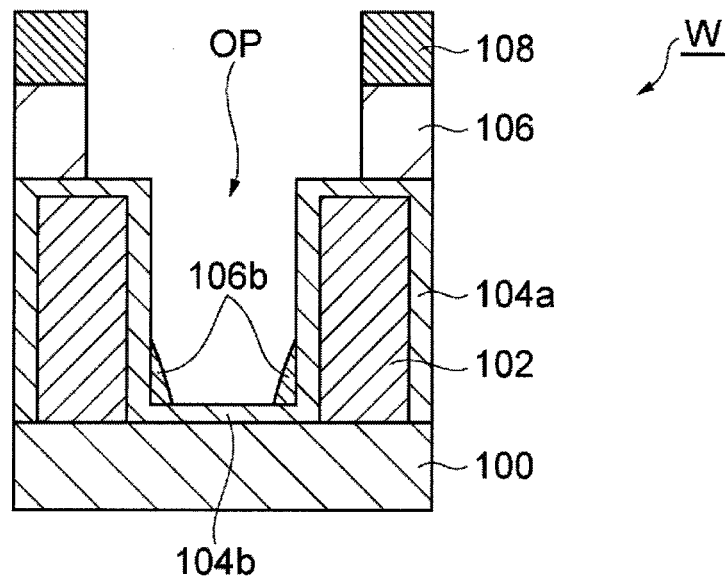
FIGS. 7A and 7B are views illustrating the cross sections of the workpiece related to the respective steps illustrated in FIG. 4.

Specifically, step SA17 may be executed subsequent to step SA16. At step SA17, the oxide region 106 existing between the adjacent raised regions 102 is etched under the same conditions as those of step SA15. In the case where step SA17 is performed using the plasma processing apparatus 10, the control unit Cnt may execute the same control as the control of step SA15. When step SA17 is performed, as illustrated in FIG. 7A, an opening OP which exposes the second section 104b therethrough is formed in the wafer W. However, as illustrated in FIG. 7A, a residue 106b formed of silicon oxide is left in the corner portions surrounded by the second section 104b and the first sections 104a. The removal of the residue 106b will be described later.

Figure 8:
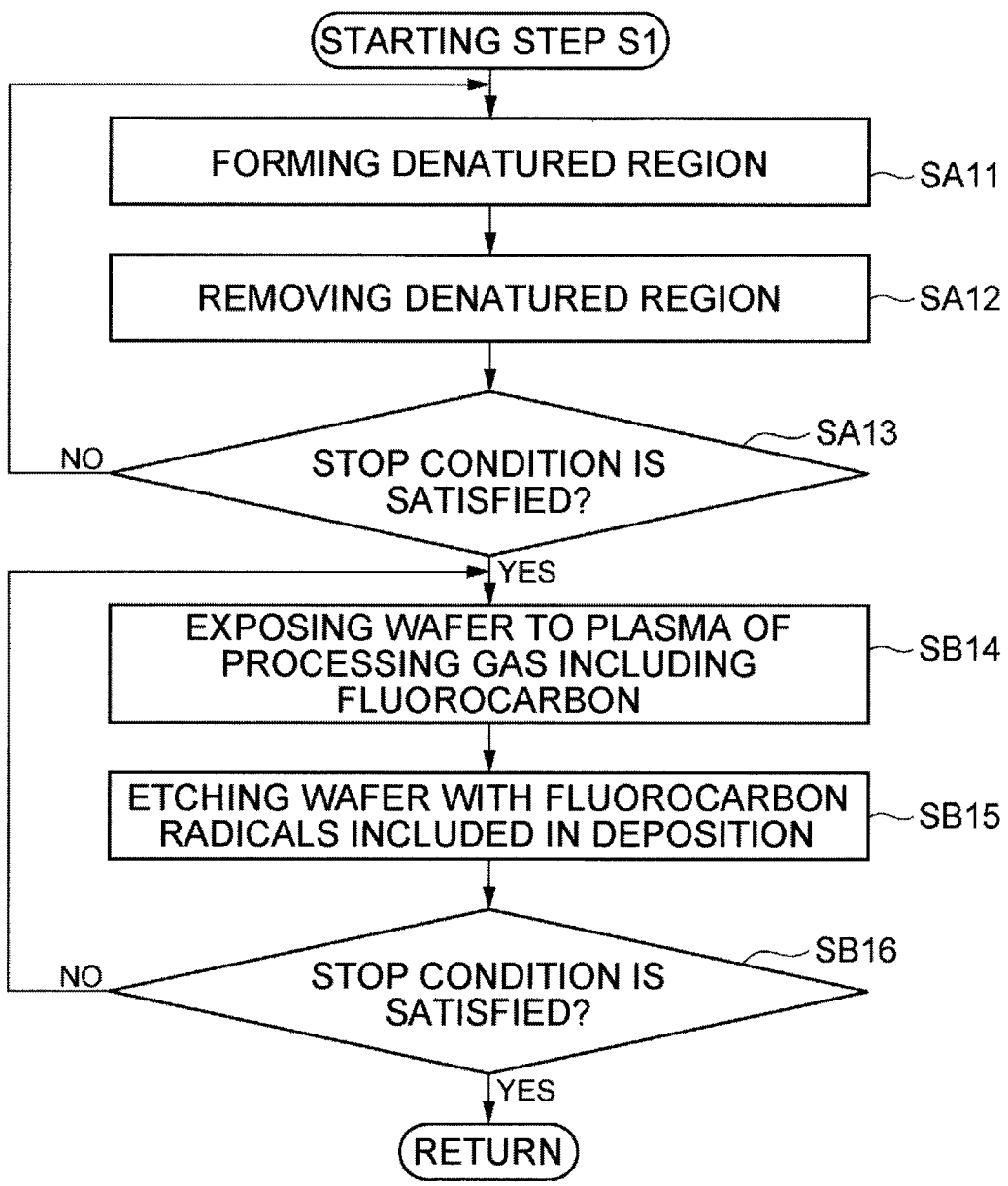
FIG. 8 is a flowchart illustrating another exemplary embodiment of step S1 illustrated in FIG. 1.
Figure 9A:
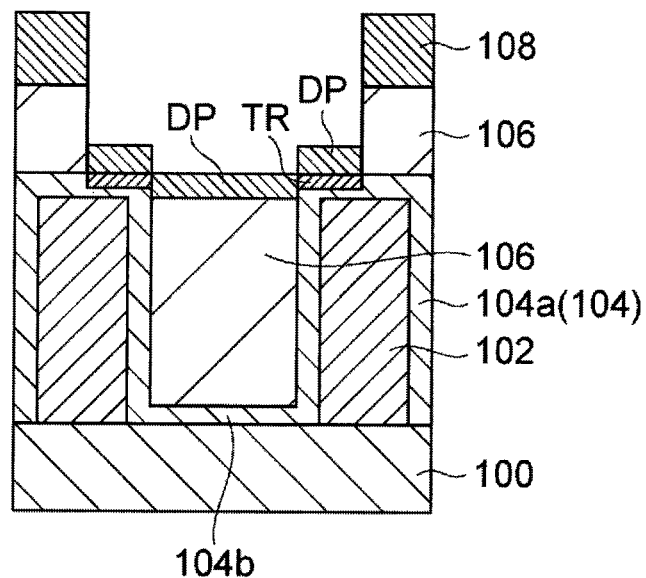
FIGS. 9A and 9B are views illustrating the cross sections of a workpiece related to the respective steps illustrated in FIG. 8.
Figure 9B:
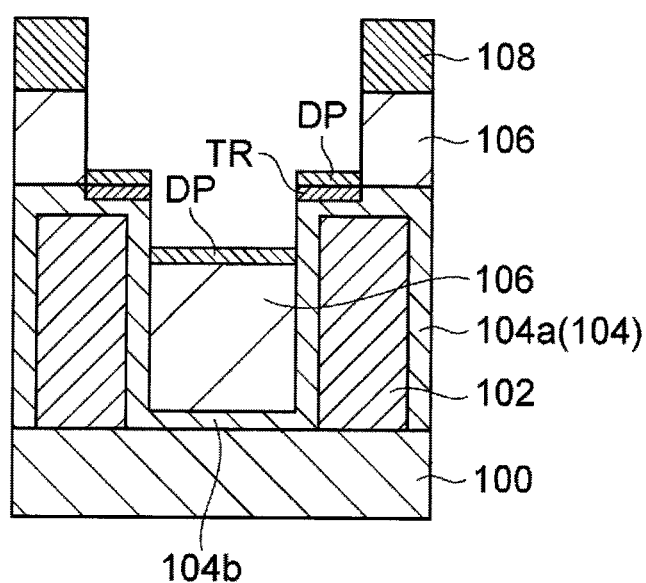

Hereinafter, another exemplary embodiment of step S1 will be described. FIG. 8 is a flowchart illustrating another exemplary embodiment of step S1 illustrated in FIG. 1. As illustrated in FIG. 8, in another exemplary embodiment, step S1 includes step SB14 and step SB15 in addition to step SA11, step SA12, and step SA13 which are described above. Step SB14 and step SB15 will now be described with reference to FIGS. 8 and 9. FIGS. 9A and 9B are views illustrating the cross sections of a workpiece related to the respective steps illustrated in FIG. 8.

At step S1 illustrated in FIG. 8, the wafer W is brought into the state illustrated in FIG. 5C by executing step SA11 and step SA12 a predetermined number of times. At step S1 illustrated in FIG. 8, step SB14 and step SB15 are executed a predetermined number of times with respect to the wafer W of this state.

At step SB14, the wafer W is exposed to the plasma of a fourth gas including a fluorocarbon gas. At step SB14, plasma is generated by the fourth gas being excited. The wafer W is exposed to the plasma thus generated. The fourth gas is a gas including a fluorocarbon gas. The fluorocarbon gas may be a gas containing at least one of $C_4F_6$, $C_4F_8$ and $C_6F_6$. The fourth gas may further include a rare gas such as an Ar gas, and an $O_2$ gas.

In the case where step SB14 is executed using the plasma processing apparatus 10, the fourth gas is supplied from the gas source group 40 into the processing container 12. At step SB14, a high-frequency power is supplied from the first high-frequency power source 62 to the lower electrode LE. At step SB14, a high-frequency bias power may be supplied from the second high-frequency power source 64 to the lower electrode LE. At step SB14, the pressure of the internal space of the processing container 12 is set at a predetermined pressure by the exhaust device 50. For example, the pressure of the internal space of the processing container 12 is set at a pressure within a range of 20 mTorr (2.666 Pa) to 50 mTorr (6.666 Pa). At step SB14, the distance between the upper electrode 30 and the top surface of the mounting table PD is set at a distance within a range of 20 mm to 50 mm. Consequently, the plasma of the fluorocarbon gas is generated within the processing container 12. The wafer W mounted on the mounting table PD is exposed to the plasma. At step SB14, a voltage may be applied from the power source 70 to the upper electrode 30. The voltage applied to the upper electrode 30 by the power source 70 may be a voltage of −150 V or less. That is, the voltage applied to the upper electrode 30 by the power source 70 may be a negative voltage having an absolute value of 150 V or more. The operations of the respective parts of the plasma processing apparatus 10 during the execution of step SB14 may be controlled by the control unit Cnt.

At step SB14, active species of atoms and/or molecules derived from fluorocarbon, e.g., active species of fluorine and/or fluorocarbon initially collide with the oxide region 106 of the wafer W having the state illustrated in FIG. 5C. Accordingly, the oxide region 106 is etched at step SB14. At step SB14, as illustrated in FIG. 9A, a deposition including fluorocarbon adheres to the oxide region 106. Thus, a deposition DP including fluorocarbon is formed on the oxide region 106. The thickness of the deposition DP increases along with the elapse of the execution time of step SB14.

At step SB14, the active species of atoms and/or molecules derived from fluorocarbon, e.g., the active species of fluorine and/or fluorocarbon initially collide with the nitride region 104 of the wafer W illustrated in FIG. 5C. When the active species collide with the nitride region 104, as illustrated in FIG. 9A, the surface layer portion extending at a specified depth from the surface of the nitride region 104 is modified and can be formed into a modified region TR. The modified region TR contains silicon and nitrogen which constitute the nitride region 104 and atoms and/or molecules which are included in the fourth gas. For example, the modified region TR may contain not only silicon and nitrogen but also carbon, fluorine, and oxygen included in the fourth gas. At step SB14, a deposition DP is formed on the modified region TR.

In the case where the voltage is applied from the power source 70 to the upper electrode 30 at step SB14, the positive ions existing in the processing space S collide with the electrode plate 34. Thus, silicon is emitted from the electrode plate 34. The emitted silicon is combined with active species of fluorine, e.g., fluorine radicals and fluorine ions, which exist within the processing space S, thereby reducing the amount of active species of fluorine. Thus, the etching of the nitride region 104 by the active species of fluorine is suppressed. On the other hand, the oxide region 106 is etched by the active species of fluorocarbon existing in the plasma.

When the thickness of the deposition DP formed by the processing of step SB14 grows larger, the deposition DP inhibits the active species capable of etching the oxide region 106 from reaching the oxide region 106. Accordingly, when step SB14 is continuously performed, the etching of the oxide region 106 is stopped. In order to prevent the stop of the etching, step SB15 is subsequently executed.

At step SB15, the oxide region 106 is etched by the radicals of fluorocarbon included in the deposition DP. At step SB15 of an exemplary embodiment, the wafer W subjected to the processing of step SB14 is exposed to the plasma of a rare gas. The processing time of step SB15 and the processing time of step SB14 may be arbitrarily set. In an exemplary embodiment, the percentage of the processing time of step SB14 in the total sum of the processing time of step SB14 and the processing time of step SB15 may be set at a percentage within a range of 30% to 70%.

In the case where step SB15 is executed using the plasma processing apparatus 10, a rare gas is supplied from the gas source group 40. At step SB15, oxygen gas ($O_2$ gas) may be supplied in addition to the rare gas or may not be supplied. At step SB15, a high-frequency power is supplied from the first high-frequency power source 62 to the lower electrode LE. At step SB15, a high-frequency bias power may be supplied from the second high-frequency power source 64 to the lower electrode LE. At step SB15, the pressure of the internal space of the processing container 12 is set at a predetermined pressure by the exhaust device 50. For example, the pressure of the internal space of the processing container 12 is set at a pressure within a range of 20 mTorr (2.666 Pa) to 50 mTorr (6.666 Pa). At step SB15, the distance between the upper electrode 30 and the top surface of the mounting table PD is set at a distance within a range of 20 mm to 50 mm. Consequently, the plasma of the rare gas is generated within the processing container 12. The wafer W mounted on the mounting table PD is exposed to the plasma. At step SB15, a voltage may be applied from the power source 70 to the upper electrode 30. The voltage applied to the upper electrode 30 by the power source 70 may be a voltage of −150 V or less. That is, the voltage applied to the upper electrode 30 by the power source 70 may be a negative voltage having an absolute value of 150 V or more. The operations of the respective parts of the plasma processing apparatus 10 during the execution of step SB15 may be controlled by the control unit Cnt.

At step SB15, active species of rare gas atoms, e.g., ions of rare gas atoms collide with the deposition DP. Thus, as illustrated in FIG. 9B, the fluorocarbon radicals existing in the deposition DP induces the etching of the oxide region 106. The thickness of the deposition DP is reduced by step SB15. At step SB15, as illustrated in FIG. 9B, the thickness of the deposition DP on the nitride region 104 is reduced. However, the etching of the nitride region 104 is suppressed because the modified region TR exists on the nitride region 104.

In the case where the voltage is applied from the power source 70 to the upper electrode 30 at step SB15, the positive ions existing in the processing space S collide with the electrode plate 34. Accordingly, silicon is emitted from the electrode plate 34. During the execution period of step SB15, the active species of fluorine generated at step SB14 may be remain within the processing container 12 without being removed. The silicon emitted from the electrode plate 34 is combined with the active species of fluorine existing within the processing space S, thereby reducing the amount of active species of fluorine. This suppresses the etching of the nitride region 104 by the active species of fluorine. On the other hand, the oxide region 106 is etched by the fluorocarbon radicals existing in the deposition DP. In the case where oxygen gas is not supplied at step SB15, the oxide region 106 can be more selectively etched with respect to the nitride region 104.

At step S1 illustrated in FIG. 8, step SB14 is executed again after the execution of step SB15. Since the thickness of the deposition DP is reduced by the previous execution of step SB15, when the wafer W is exposed to the plasma of the fourth gas by executing step SB14 again, the oxide region 106 may be further etched. Thereafter, step SB15 is executed again so that the oxide region 106 can be etched by the fluorocarbon radicals existing in the deposition DP.

At step S1 illustrated in FIG. 8, it is determined at step SB16 whether a stop condition is satisfied. It is determined that the stop condition is satisfied, for example, when the number of repetition of a cycle including step SB14 and step SB15 reaches a predetermined number of times. In the case where the stop condition is not satisfied, the cycle including step SB14 and step SB15 is executed again. On the other hand, when the stop condition is satisfied, step S1 is terminated.

According to step S1 illustrated in FIG. 8, the stop of etching of the oxide region 106 may be prevented by alternately executing step SB14 and step SB15 more than once. As a result, it is possible to continuously etch the oxide region 106. Furthermore, it is possible to selectively etch the oxide region 106 with respect to the nitride region 104. By virtue of the execution of step S1, the wafer W is brought into the state illustrated in FIG. 7A.

Reference is made again to FIG. 1. In the method MT, step S2 is subsequently executed. At step S2, the mask 108 is removed. The mask 108 is removed by an ashing process using the plasma of oxygen gas. At step S2, the deposition deposited on the wafer W, namely the deposition containing fluorocarbon, is also removed. That is, at step S2, the organic substance existing on the wafer W is removed. By virtue of the execution of step S2, the wafer W is brought into the state illustrated in FIG. 7B. In the case where step S2 is executed in the plasma processing apparatus 10, the control unit Cnt controls the valve group 42 and the flow rate controller group 44 so as to supply an oxygen gas into the processing container 12. In order to excite the gas supplied into the processing container 12, the control unit Cnt controls the first high-frequency power source 62 so as to supply a high-frequency power to the lower electrode LE. The control unit Cnt may control the second high-frequency power source 64 so as to supply a high-frequency bias power to the lower electrode LE.

In the method MT, step S3 is subsequently executed. At step S3, the residue 106b and the second section 104b are etched. For this purpose, the wafer W is exposed to the plasma of a mixed gas which includes a hydrogen-containing gas and $NF_3$ gas. Thus, a denatured region is formed. Then, the denatured region is removed.

Figure 10:
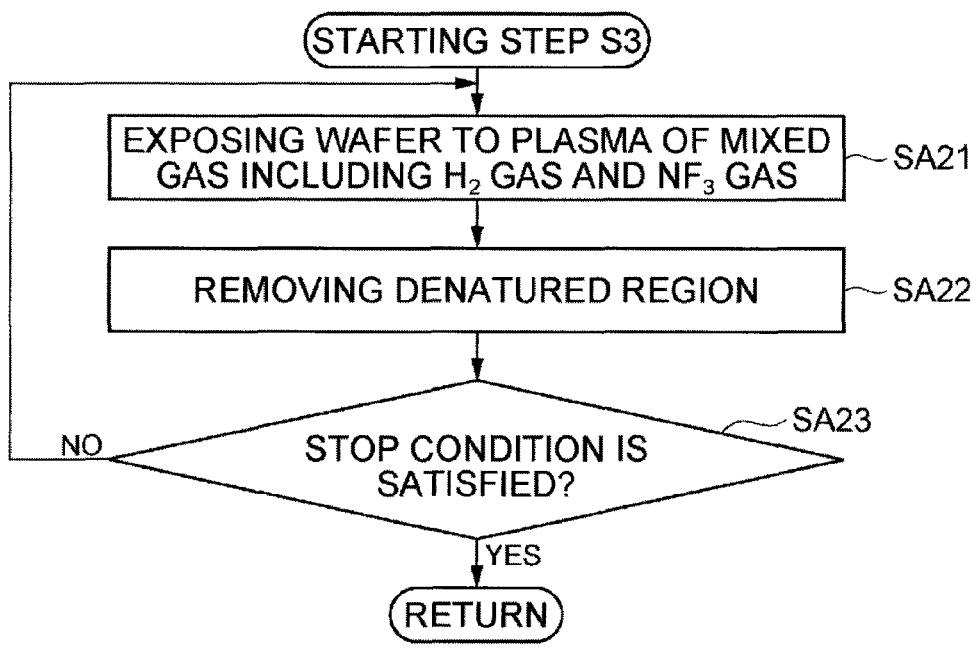
FIG. 10 is a flowchart illustrating an exemplary embodiment of step S3 illustrated in FIG. 1.
Figure 11A:
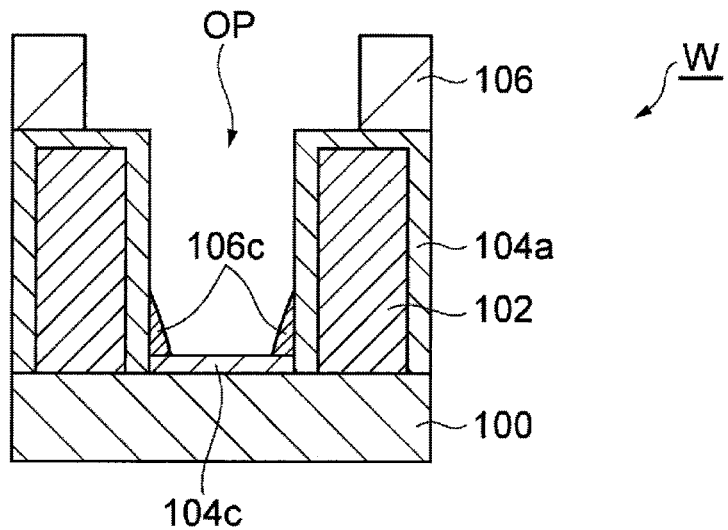
FIGS. 11A and 11B are views illustrating the cross sections of a workpiece related to the respective steps illustrated in FIG. 10.
Figure 11B:
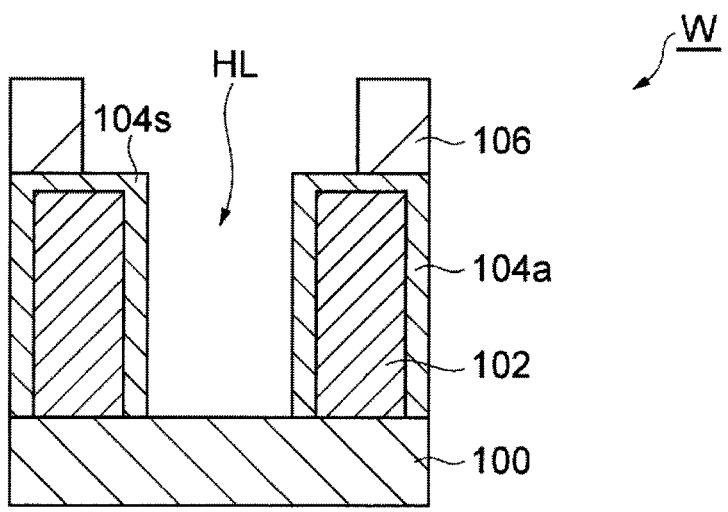

Hereinafter, an exemplary embodiment of step S3 will be described in detail with reference to FIGS. 10 and 11. FIG. 10 is a flowchart illustrating an exemplary embodiment of step S3 illustrated in FIG. 1. FIGS. 11A and 11B are views illustrating the cross sections of a workpiece related to the respective steps illustrated in FIG. 10.

Figure 7B:
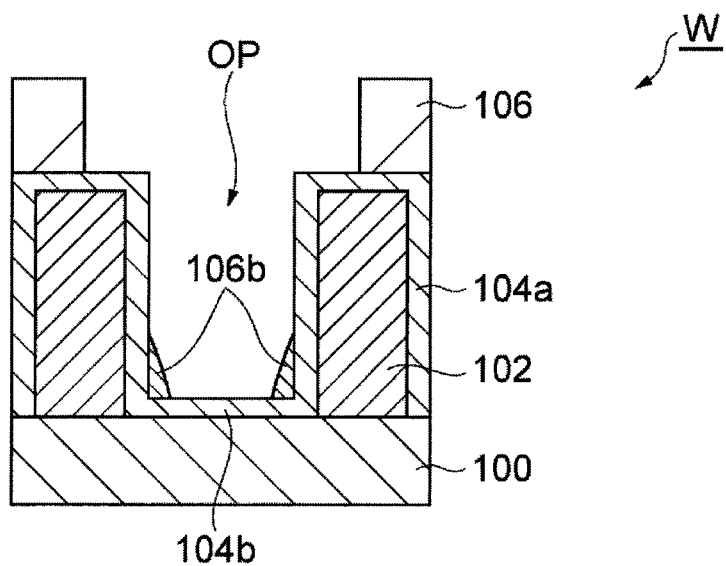

As illustrated in FIG. 10, step S3 of an exemplary embodiment includes step SA21 and step SA22. At step S21, the wafer W having the state illustrated in FIG. 7B is exposed to the plasma of a fifth gas (mixed gas) which includes $H_2$ gas and $NF_3$ gas. The fifth gas may further include a rare gas such as $N_2$ gas or an Ar gas. At step SA21, ammonium fluoride, active species of fluorine and active species of hydrogen fluoride are generated by the generation of the plasma of the fifth gas. Ammonium fluoride reacts with silicon oxide that constitutes the residue 106b. Accordingly, as illustrated in FIG. 11A, silicon oxide constituting the residue 106b is denatured into ammonium fluorosilicate. A denatured region 106c is formed from the residue 106b. The active species of hydrogen fluoride reacts with silicon nitride that constitutes the second section 104b. Thus, silicon nitride constituting the second section 104b is denatured into ammonium fluorosilicate. A denatured region 104c is formed from the second section 104b.

In the case where step SA21 is performed using the plasma processing apparatus 10, the control unit Cnt controls the valve group 42 and the flow rate controller group 44 so as to supply the fifth gas from the gas source group 40. In order to excite the fifth gas, the control unit Cnt controls the first high-frequency power source 62 so as to supply a high-frequency power to the lower electrode LE.

At step SA21, the internal pressure of the processing container 12 is set at a pressure of, e.g., 400 mTorr to 600 mTorr (53.33 Pa to 79.99 Pa). Moreover, the high-frequency power supplied from the first high-frequency power source 62 is set at an electric power of, e.g., 800 W to 1,200 W. At step SA21, the high-frequency bias power may not be supplied from the second high-frequency power source 64. The partial pressures of $NF_3$ gas and $H_2$ gas in the fifth gas is controlled within a range of 1:2 to 1:10, e.g., 1:2.5. Moreover, the temperature of the wafer W is controlled at a temperature of 60° C. or less, e.g., at a temperature of 0° C. For this purpose, the control unit Cnt may adjust the temperature of the mounting table PD by controlling the heater power source HP of the plasma processing apparatus 10. The processing time at step SA21 may be set at 30 seconds to 60 seconds.

At subsequent step SA22, the denatured region 106c and the denatured region 104c are removed. The processing performed to remove the denatured region 106c and the denatured region 104c is the same as the processing of step SA12 described above. In the case where step SA22 is executed using the plasma processing apparatus 10, the control unit Cnt executes the same control as the control executed at step SA12. By executing step SA22, as illustrated in FIG. 11B, there is formed a hole HL which extends from the top surface of the oxide region 106 to the top surface of the base layer 100 through between the adjacent raised regions 102.

Step SA21 and step SA22 may be alternately executed a predetermined number of times. At step SA23, determination is made as to whether the number of repetition of step SA21 and step SA22 satisfies a stop condition. That is, at step SA23, determination is made as to whether step SA21 and step SA22 have been executed a predetermined number of times. When the stop condition is not satisfied, step SA21 and step SA22 are repeated again. On the other hand, when the stop condition is satisfied, step S3 comes to an end. That is, the method MT is terminated.

The residue 106b may not be removed by the plasma of the fluorocarbon gas used in the related art. Therefore, until the second section 104b is removed, the first sections 104a, especially the shoulder portions 104s of the first sections 104a (see FIG. 11B), are heavily etched by the active species of fluorine or the active species of HF. On the other hand, according to step S3 of the exemplary embodiment illustrated in FIG. 10, the residue 106b is removed. It is therefore possible to reduce the cutting of the first sections 104a, especially the shoulder portions 104s. According to step S3 of the exemplary embodiment illustrated in FIG. 10, it is possible to simultaneously remove the residue 106b and the second section 104b.

Figure 12:
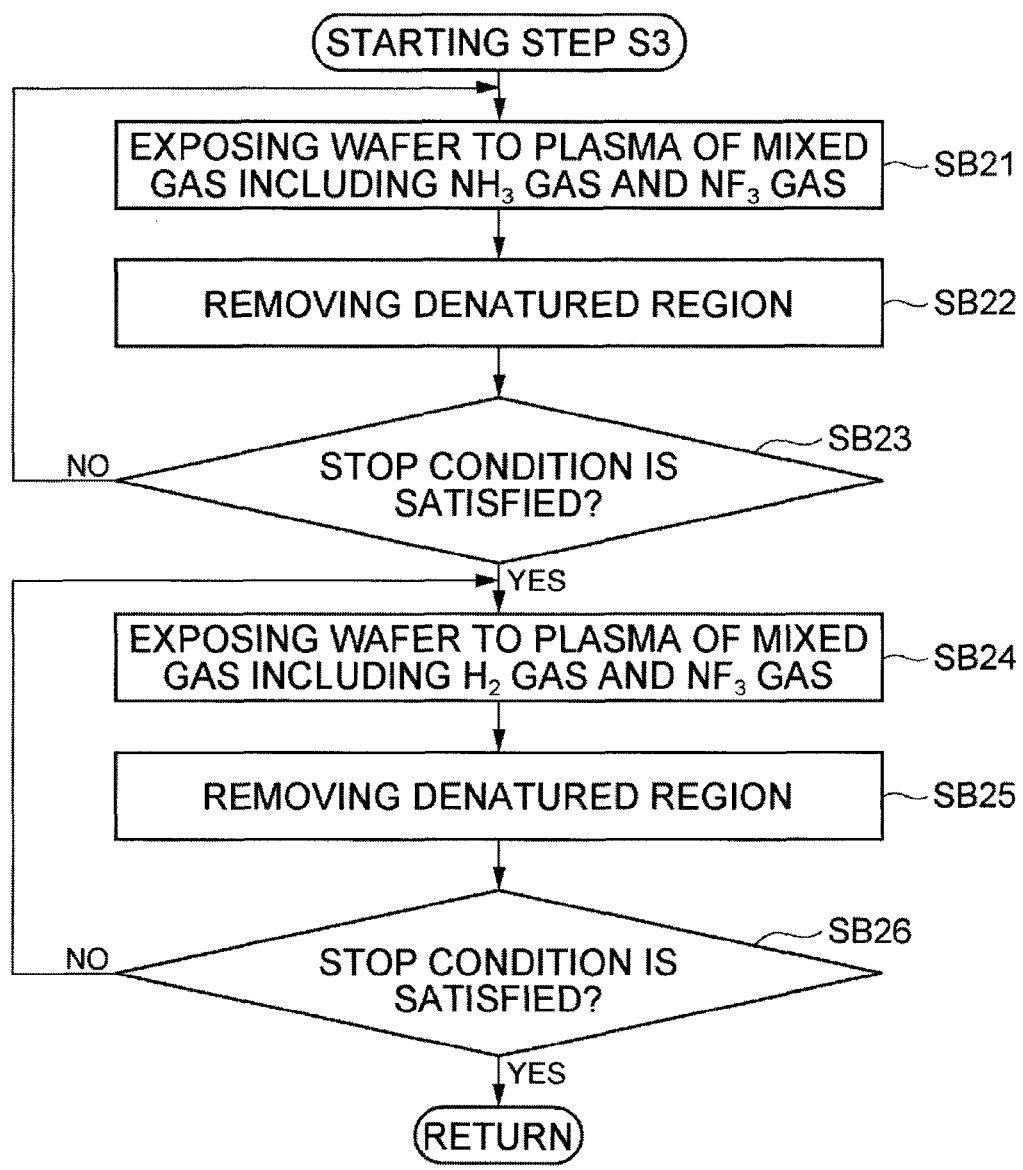
FIG. 12 is a flowchart illustrating another exemplary embodiment of step S3 illustrated in FIG. 1
Figure 13A:
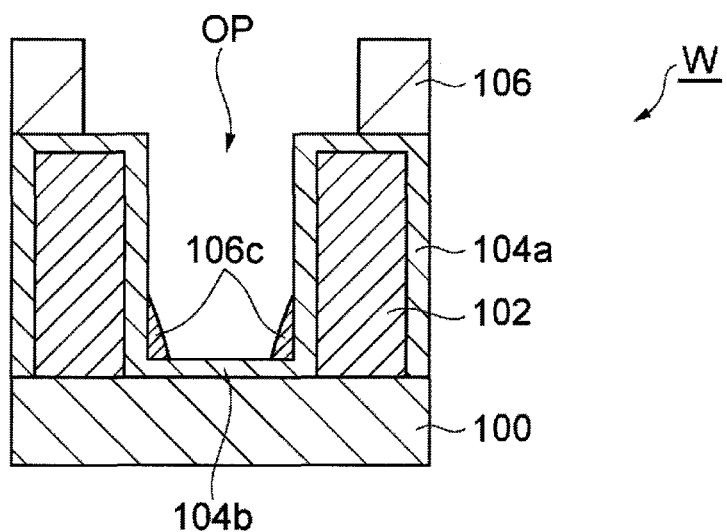
FIGS. 13A and 13B are views illustrating the cross sections of a workpiece related to the respective steps illustrated in FIG. 12.

Hereinafter, another exemplary embodiment of step S3 will be described in detail with reference to FIGS. 12, 13 and 14. FIG. 12 is a flowchart illustrating another exemplary embodiment of step S3 illustrated in FIG. 1. FIGS. 13A, 13B, 14A, and 14B are views illustrating the cross sections of a workpiece related to the respective steps illustrated in FIG. 12.

As illustrated in FIG. 12, step S3 of another exemplary embodiment includes step SB21 to step SB26. At step SB21, the wafer W having the state illustrated in FIG. 7B is exposed to the plasma of a sixth gas (mixed gas) which includes $NH_3$ gas and $NF_3$ gas. The sixth gas may further include a rare gas such as an Ar gas. By the execution of step SB21, as illustrated in FIG. 13A, silicon oxide constituting the residue 106b is denatured to ammonium fluorosilicate, whereby a denatured region 106c is formed.

As compared with the aforementioned fifth gas, i.e., $H_2$ gas and $NF_3$ gas, the sixth gas, i.e., the gas including $NH_3$ gas and $NF_3$ gas, can generate ammonium fluoride by generating low dissociation plasma. Accordingly, as compared with the fifth gas, the sixth gas reduces the produced amount of the active species of fluorine and the active species of hydrogen fluoride in the plasma. As a result, it is possible to denature the residue 106b and to form the denatured region 106c while suppressing the denaturation and cutting of the second section 104b.

In the case where step SB21 is performed using the plasma processing apparatus 10, the control unit Cnt controls the valve group 42 and the flow rate controller group 44 so as to supply the sixth gas from the gas source group 40. In order to excite the sixth gas, the control unit Cnt controls the first high-frequency power source 62 so as to supply a high-frequency power to the lower electrode LE.

At step SB21, the internal pressure of the processing container 12 is set at a pressure of, e.g., 400 mTorr to 600 mTorr (53.33 Pa to 79.99 Pa). Moreover, the high-frequency power supplied from the first high-frequency power source 62 is set at electric power of, e.g., 800 W to 1,200 W. At step SB21, the high-frequency bias power may not be supplied from the second high-frequency power source 64. Moreover, the temperature of the wafer W is controlled at a temperature of 60° C. or less, e.g., at a temperature of 0° C. For this purpose, the control unit Cnt may adjust the temperature of the mounting table PD by controlling the heater power source HP of the plasma processing apparatus 10. The processing time at step SB21 may be set at 30 seconds to 60 seconds.

At subsequent step SB22, the denatured region 106c is removed. The processing performed to remove the denatured region 106c is the same as the processing of step SA12 described above. In the case where step SB22 is executed using the plasma processing apparatus 10, the control unit Cnt executes the same control as the control executed at step SA12. By executing step SB22, as illustrated in FIG. 13B, the denatured region 106c is removed. That is, the residue 106b is removed.

Step SB21 and step SB22 may be alternately executed a predetermined number of times. At step SB23, determination is made as to whether the number of repetition of step SB21 and step SB22 satisfies a stop condition. That is, at step SB23, determination is made as to whether step SB21 and step SB22 have been executed a predetermined number of times. When the stop condition is not satisfied, step SB21 and step SB22 are repeated again. On the other hand, if the stop condition is satisfied, the process proceeds to step SB24.

Figure 13B:
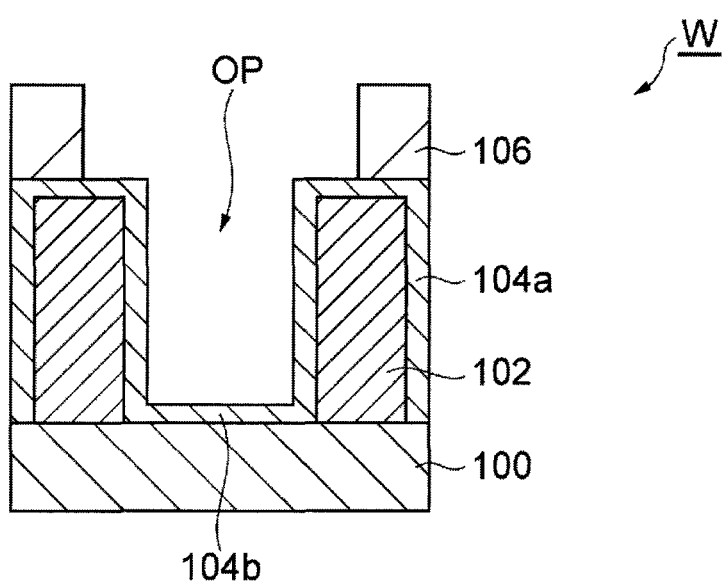
Figure 14A:
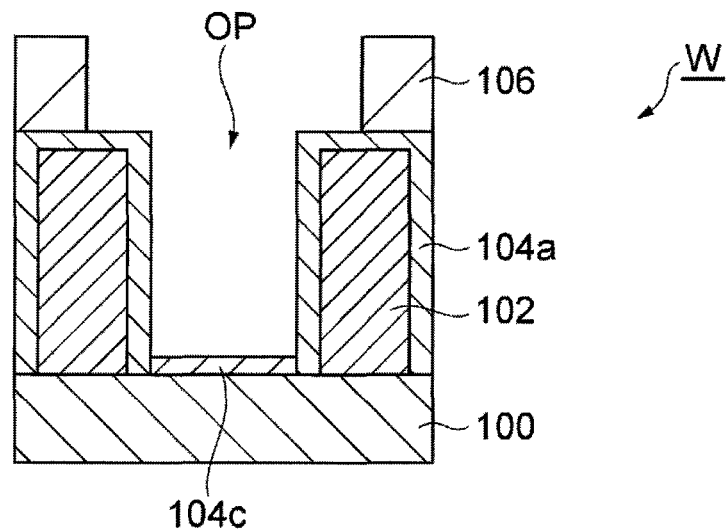
FIGS. 14A and 14B are views illustrating the cross sections of the workpiece related to the respective steps illustrated in FIG. 12
Figure 14B:
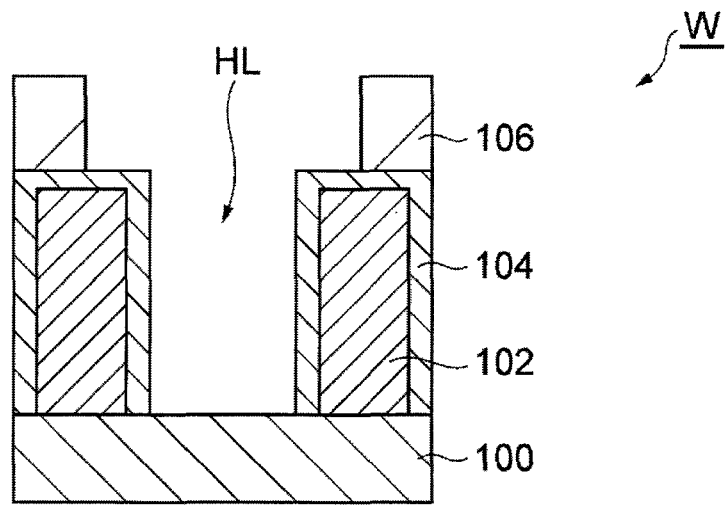

At step SB24, the wafer W having the state illustrated in FIG. 13B is exposed to the plasma of the fifth gas. The processing of step SB24 is the same as the processing of step SB21 described above. By the execution of step SB24, silicon nitride constituting the second section 104b is denatured to ammonium fluorosilicate. Thus, as illustrated in FIG. 14A, a denatured region 104c is formed from the second section 104b.

At subsequent step SB25, the denatured region 104c is removed. The processing performed to remove the denatured region 104c is the same as the processing of step SA12 described above. In the case where step SB25 is executed using the plasma processing apparatus 10, the control unit Cnt executes the same control as the control executed at step SA12. By executing step SB25, as illustrated in FIG. 14B, the denatured region 104c is removed. That is, the second section 104b is removed. As a result, as illustrated in FIG. 14B, a hole HL extending from the top surface of the oxide region 106 to the top surface of the base layer 100 through between the adjacent raised regions 102 is formed in a self-aligned manner.

According to step S3 of the exemplary embodiment illustrated in FIG. 12, when removing the residue 106b, it is possible to use the sixth gas which can generate ammonium fluoride by generating the plasma of a low dissociation state. Accordingly, it is possible to suppress the cutting of the first sections 104a during the time period in which the removal of the residue 106b is performed. Then, by using the fifth gas that includes $H_2$ gas and $NF_3$ gas, it is possible to increase the etching rate of the second section 104b. Therefore, according to step S3 of the exemplary embodiment illustrated in FIG. 12, it becomes possible to remove the residue 106b and the second section 104b while further reducing the cutting of the first sections 104a.

Figure 15:
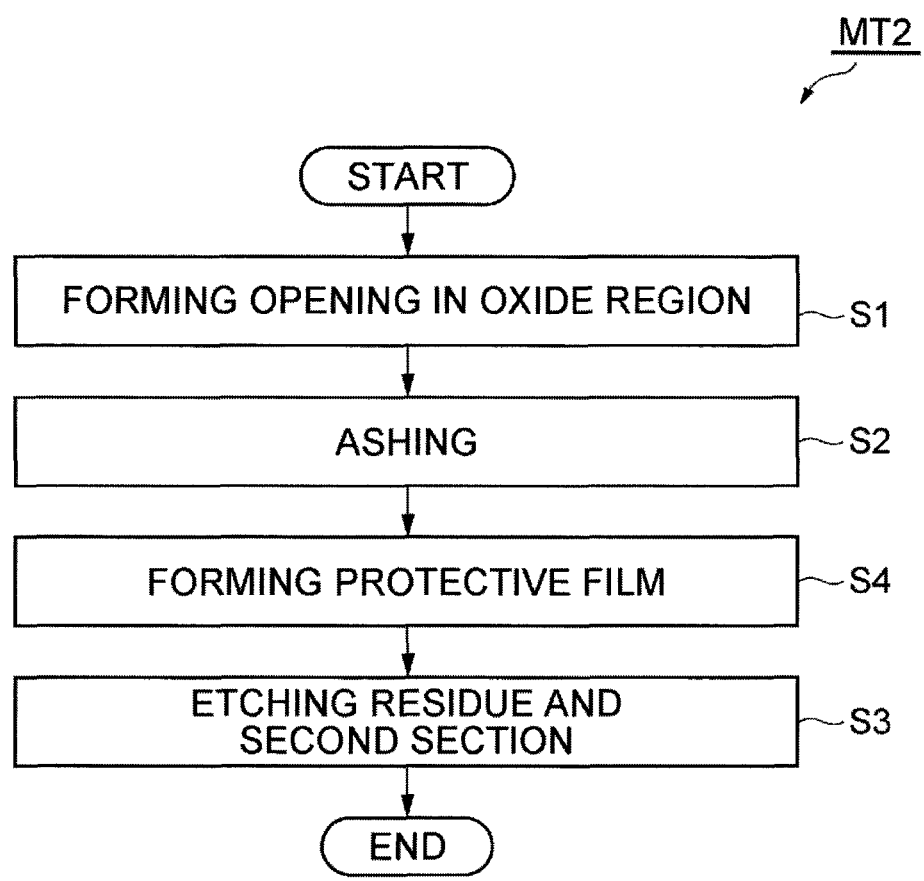
FIG. 15 is a flowchart illustrating a method of processing a workpiece according to another exemplary embodiment.
Figure 16A:
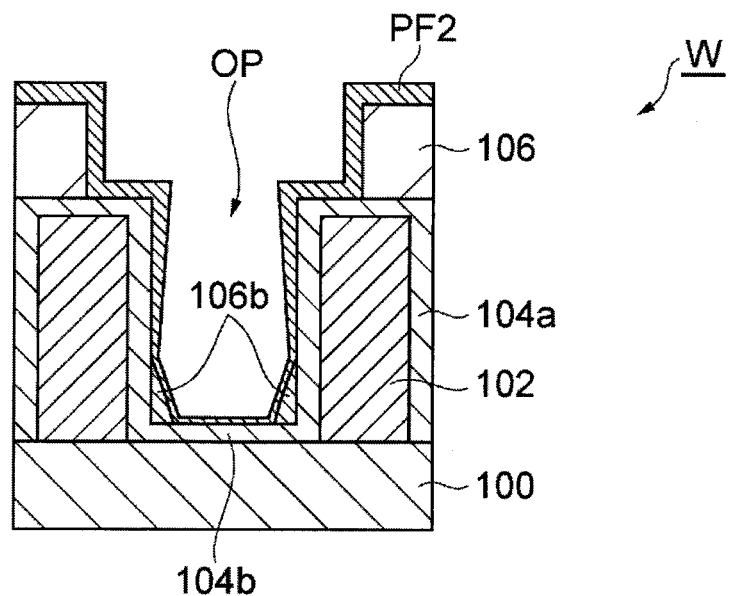
FIGS. 16A and 16B are views illustrating the cross sections of a workpiece related to some steps of the method illustrated in FIG. 15.
Figure 16B:
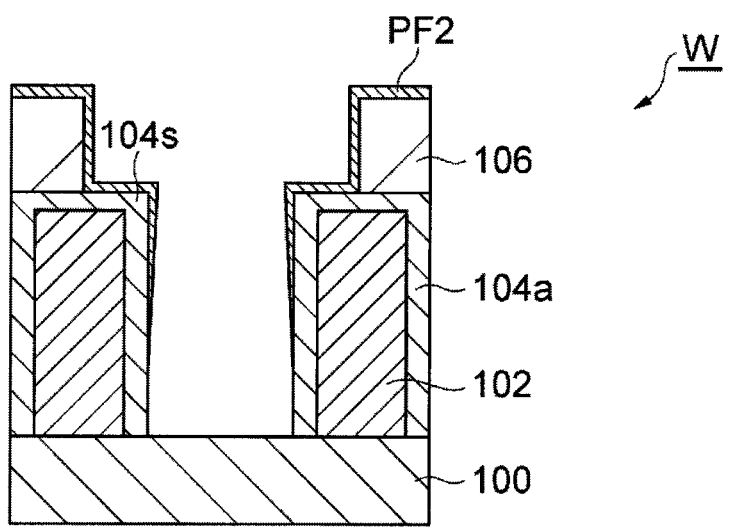

Hereinafter, a method of processing a workpiece according to another exemplary embodiment will be described with reference to FIG. 15. FIG. 15 is a flowchart illustrating a method of processing a workpiece according to another exemplary embodiment. FIGS. 16A and 16B are views illustrating the cross sections of a workpiece related to some steps of the method illustrated in FIG. 15. The method MT2 illustrated in FIG. 15 is different from the method MT in that the method MT2 includes step S4 executed between step S2 and step S3.

At step S4, a protective film PF2 is formed on the first sections 104a and the second section 104b. In order to form the protective film PF2, the plasma of a processing gas including a fluorocarbon gas is generated at step S4. The wafer W subjected to step S2, namely the wafer W illustrated in FIG. 7B, is processed by the plasma. A gas including at least one of $C_4F_6$, $C_4F_8$, $C_6F_6$, $C_3F_8$, and $C_5F_8$ is used as the fluorocarbon gas. The processing gas used at step S4 may further include a rare gas such as, for example, Ar gas. The percentage of the flow rate of the fluorocarbon gas with respect to the total flow rate of the processing gas may be 1% or less. The remaining percentage may be occupied by the rare gas. The processing gas used to form the protective film PF2 at step S4 may include a hydrofluorocarbon gas or a silicon-containing gas instead of the fluorocarbon gas. A gas including $CH_2F_2$ or $CHF_3$ is illustrated as the hydrofluorocarbon gas. A gas including $SiF_4$ and $H_2$ or a gas including $SiCl_4$ and $H_2$ is illustrated as the silicon-containing gas.

In the case where step S4 is performed using the plasma processing apparatus 10, the control unit Cnt controls the valve group 42 and the flow rate controller group 44 so as to supply the processing gas including the fluorocarbon gas from the gas source group 40. Furthermore, the control unit Cnt controls the first high-frequency power source 62 so as to supply a high-frequency power to the lower electrode LE. Furthermore, the control unit Cnt controls the second high-frequency power source 64 so that the high-frequency bias power becomes a low power, for example, so that the high-frequency bias power is not supplied. For example, the high-frequency power supplied to the lower electrode LE at step S4 may be 500 W and the internal pressure of the processing container 12 at step S4 may be 30 mTorr (4 Pa).

At step S4, as illustrated in FIG. 16A, a protective film PF2 is formed on the first sections 104a, the second section 104b, and the residue 106b by the molecules of fluorocarbon. The amount of the molecules contributed to the formation of the protective film PF2 becomes larger in the vicinity of the top portions of the raised regions 102, namely in the vicinity of the open end portion of the opening OP, and becomes smaller in the deep portion of the opening OP. Accordingly, the thickness of the protective film PF2 grows larger in the vicinity of the top portions of the raised regions 102 and grows smaller in the vicinity of the deep portion of the opening OP. That is, the thickness of the protective film PF2 becomes larger on the first sections 104a and becomes smaller on the residue 106b and the second section 104b.

In the method MT, step S3 is executed after the protective film PF2 is formed. As described above, the thickness of the protective film PF2 is large on the first sections 104a and is small on the residue 106b and the second section 104b. Therefore, during the execution of step S3, the protective film PF2 formed on the second section 104b and the residue 106b is removed at an early stage. The residue 106b and the second section 104b are etched. On the other hand, the protective film PF2 formed on the first sections 104a is maintained during the execution period of step S3. Accordingly, as illustrated in FIG. 16B, it is possible to further suppress the cutting of the first sections 104a, particularly the cutting of the shoulder portions 104s, which may otherwise be caused by the execution of step S3.

Figure 17:
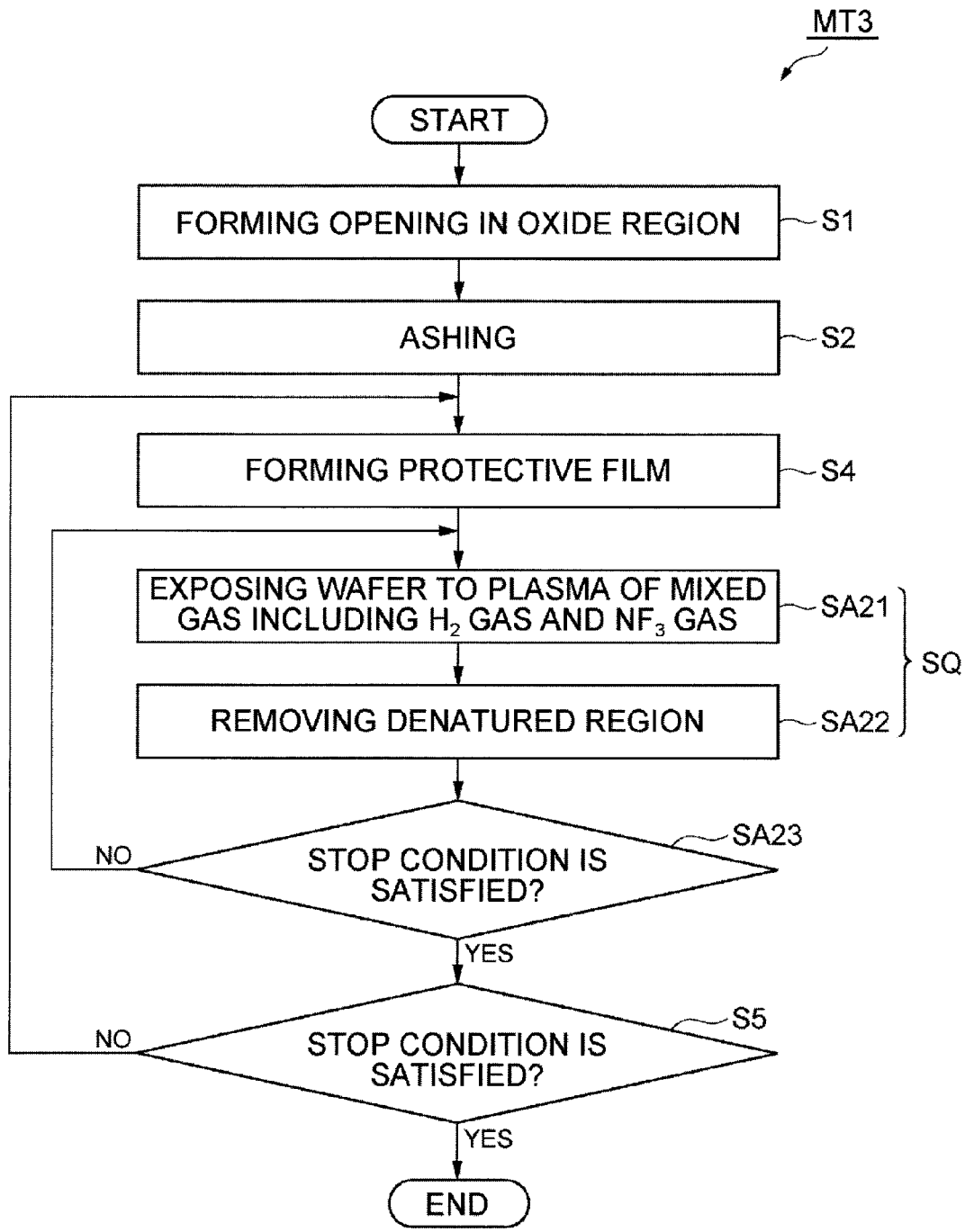
FIG. 17 is a flowchart illustrating a method of processing a workpiece processing method according to another exemplary embodiment.
Figure 18:
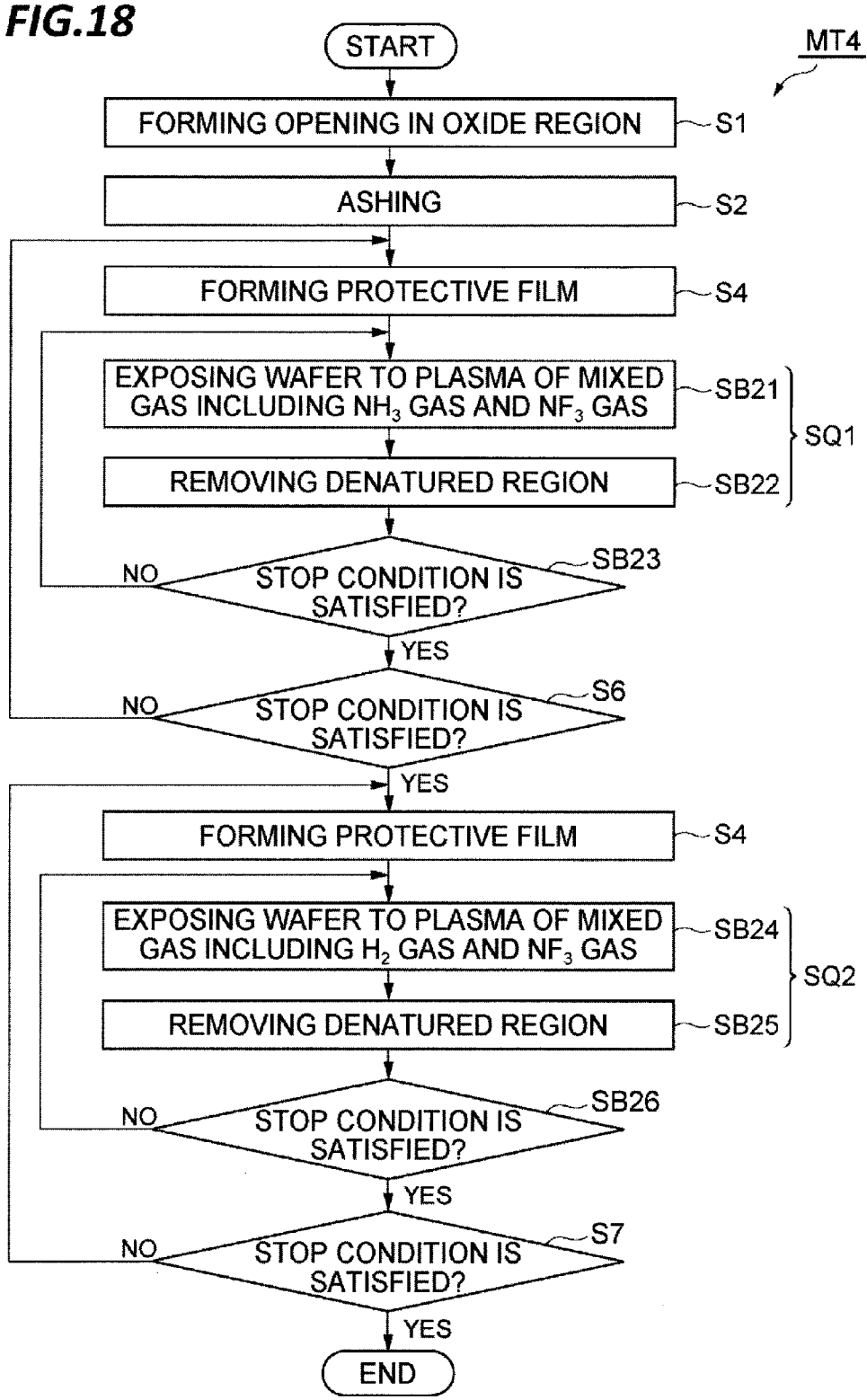
FIG. 18 is a flowchart illustrating a workpiece processing method according to a still another exemplary embodiment.

The execution of step S4 and the execution of one or more times of the sequence including the formation of the denatured region and the removal of the denatured region at step S3 may be alternately performed. FIGS. 17 and 18 are flowcharts illustrating methods of processing a workpiece according to a further exemplary embodiment and a still further exemplary embodiment. In the method MT3 illustrated in FIG. 17, after the execution of step S4, the execution of the sequence SQ including step SA21 and step SA22 described with reference to FIG. 10 is performed once or more. In the method MT3, the execution of step S4 and the execution of one or more times of the sequence SQ are alternately performed a predetermined number of times. When it is determined at step S5 that the stop condition is not satisfied, namely that the number of alternate repetition of the execution of step S4 and the execution of one or more times of the sequence SQ has not reached a predetermined number, step S4 is executed again. On the other hand, when it is determined at step S5 that the stop condition is satisfied, namely that the number of alternate repetition of the execution of step S4 and the execution of one or more times of the sequence SQ has reached the predetermined number, the method MT3 is terminated.

In the method MT4 illustrated in FIG. 18, after the execution of step S4, the execution of the sequence SQ1 including step SB21 and step SB22 described with reference to FIG. 12 is performed once or more. In the method MT4, the execution of step S4 and the execution of one or more times of the sequence SQ1 are alternately performed a predetermined number of times. When it is determined at step S6 that the stop condition is not satisfied, namely that the number of alternate repetition of the execution of step S4 and the execution of one or more times of the sequence SQ1 has not reached a predetermined number, step S4 is executed again. On the other hand, when it is determined at step S6 that the stop condition is satisfied, namely that the number of alternate repetition of the execution of step S4 and the execution of one or more times of the sequence SQ1 has reached the predetermined number, the execution of step S4' and the execution of one or more times of the sequence SQ2 including step SB24 and step SB25 described with reference to FIG. 12 are alternately performed a predetermined number of times. When it is determined at step S7 that the stop condition is not satisfied, namely that the number of alternate repetition of the execution of step S4 and the execution of one or more times of the sequence SQ2 has not reached a predetermined number, step S4 is executed again. On the other hand, when it is determined at step S7 that the stop condition is satisfied, namely that the number of alternate repetition of the execution of step S4 and the execution of one or more times of the sequence SQ2 has reached the predetermined number, the method MT4 is terminated.

Hereinafter, descriptions will be made on Test Example 1 which was conducted to evaluate the methods according to the different exemplary embodiments described above. In Test Example 1, the wafer W illustrated in FIG. 2 was used as a processing target and the processing of the method MT illustrated in FIGS. 1, 4 and 10 was performed using the plasma processing apparatus 10 illustrated in FIG. 3. The processing conditions in Test Example 1 of the respective steps illustrated in FIG. 10 are indicated below.

Figure 19:
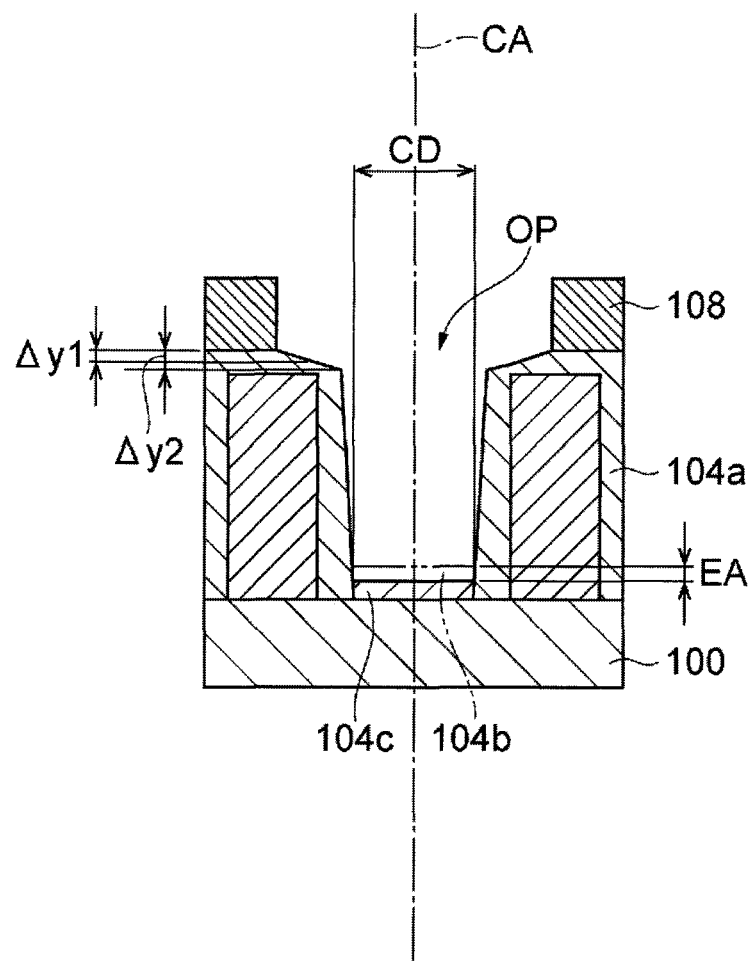
FIG. 19 is a view illustrating various kinds of dimensions measured in Test Example 1, Comparative Test Example 1, and Comparative Test Example 2.

<Processing Conditions>
Step SA21
NF$_3$ gas flow rate/H$_2$ gas flow rate/N$_2$ gas flow rate/Ar gas flow rate: 120 sccm/300 sccm/300 sccm/1,000 sccm
High-frequency power of first high-frequency power source 62: 1,000 W
Temperature of wafer W: 0° C.
Processing time: 45 seconds
Step SA22
Temperature of wafer W: 180° C.
Processing time: 60 seconds
Number of times of executing step SA21 and step SA22: five times In Comparative Test Example 1 and Comparative Test Example 2, instead of step SA21 and step SA22 of Test Example 1, step S101 and step S102 of the following processing conditions were performed with respect to the same wafer W.
<Processing Conditions of Step S101 of Comparative Experimental Example 1>
C$_4$F$_8$ gas flow rate/Ar gas flow rate/N$_2$ gas flow rate/O$_2$ gas flow rate: 120 sccm/300 sccm/300 sccm/1000 sccm
High-frequency power of first high-frequency power source 62: 400 W
High-frequency bias power of second high-frequency power source 64: 50 W
Processing time: 30 seconds
<Processing Conditions of Step S102 of Comparative Experimental Example 2>
CH$_2$F$_2$ gas flow rate/Ar gas flow rate/O$_2$ gas flow rate: 30 sccm/600 sccm/14 sccm
High-frequency power of first high-frequency power source 62: 200 W
High-frequency bias power of second high-frequency power source 64: 200 W
Processing time: 10 seconds Then, the various kinds of dimensions of the wafer W subjected to the processing of each of Test Example 1, Comparative Test Example 1, and Comparative Test Example 2, namely the various kinds of dimensions illustrated in FIG. 19, were measured. Specifically, the width CD, the cutting amount $\Delta y1$, the cutting amount $\Delta y2$, and the etching amount EA were measured. The width CD refers to the width of the opening OP in the position where the top surface of the second section 104b has existed, namely in the position where the bottom surface of the oxide region 106 has existed. The cutting amount $\Delta y1$ refers to the cutting amount of the first sections 104a in the position spaced apart 40 nm from the centerline CA of the opening OP in the direction orthogonal to the centerline CA. In Test Example 1, the cutting amount $\Delta y1$ refers to the cutting amount of the first sections 104a generated by the processing of step SA21 and step SA22. In Comparative Test Example 1, the cutting amount $\Delta y1$ refers to the cutting amount of the first sections 104a generated by the processing of step S101. In Comparative Test Example 2, the cutting amount $\Delta y1$ refers to the cutting amount of the first sections 104a generated by the processing of step S102. The etching amount EA refers to the distance at which the second section 104b is etched in the depth direction.

The measurement results are illustrated in Table 1. As illustrated in Table 1, according to Test Example 1, it was confirmed that it is possible to increase the width CD of the opening OP by removing the residue 106b, to largely etch the second section 104b and to reduce the cutting of the first sections 104a. On the other hand, in Comparative Test Example 1, the removal of the residue 106b was insufficient and, consequently, the width CD of the opening OP was reduced. Furthermore, in comparative example 1, the first sections 104a were largely cut. In Comparative Test Example 2, the etching amount of the second section 104b was reduced. From these measurement results, the effectiveness of the method MT was confirmed.

TABLE 1

| | $\Delta y1$ (nm) | $\Delta y2$ (nm) | Etching amount EA of second section (nm) | CD (nm) |
|---|---|---|---|---|
| Test Example | 6.0 | 8.5 | 8.7 | 13.5 |
| Comparative Test Example 1 | 26.6 | 30.0 | 6.3 | 8.9 |
| Comparative Test Example 2 | 7.6 | 10.1 | 4.8 | 10.3 |

Hereinafter, Test Example 2 and Test Example 3 will be described. In Test Example 2, a wafer having a silicon nitride region and a silicon oxide region was exposed to the plasma of a fifth gas and, then, a denatured region was removed. In Test Example 3, a wafer having a silicon nitride region and a silicon oxide region was exposed to the plasma of a sixth gas and, then, a denatured region was removed. The processing conditions of Test Example 2 and Test Example 3 are indicated below.
<Processing Conditions of Test Example 2>
Plasma Processing by Fifth Gas
NF$_3$ gas flow rate/H$_2$ gas flow rate/N$_2$ gas flow rate/Ar gas flow rate: 120 sccm/300 sccm/300 sccm/800 sccm
High-frequency power of first high-frequency power source 62: 1,000 W
Temperature of wafer W: 0° C.
Processing time: 30 seconds
Removal Processing of Denatured Region
Temperature of wafer W: 180° C.
<Processing Conditions of Test Example 3>
Plasma Processing by Sixth Gas
NF$_3$ gas flow rate/NH$_3$ gas flow rate/Ar gas flow rate: 30 sccm/90 sccm/120 sccm
High-frequency power of first high-frequency power source 62: 200 W
Temperature of wafer W: 0° C.

Processing time: 30 seconds

Removal Processing of Denatured Region

Temperature of wafer W: 180° C.

With regard to Test Example 2 and Test Example 3, the cut distances of the silicon nitride region and the silicon oxide region in the depth direction were found. The selection ratio of the etching of the silicon oxide region with respect to the etching of the silicon nitride region was found from the distances. The selection ratio was 3.15 in Test Example 2, namely in the test example using the fifth gas. Furthermore, the selection ratio was 15.2 in Test Example 3, namely in the test example using the sixth gas. From these results, it was confirmed that the use of the sixth gas enables the cutting of the first sections 104a to be further reduced and the oxide region 106 to be removed.

While various exemplary embodiments have been described above, various modified embodiments may be made without being limited to the exemplary embodiments described above. For example, although the aforementioned plasma processing apparatus 10 is a capacitively-coupled plasma processing apparatus, the plasma processing apparatus which may be used to implement the method MT may be an arbitrary plasma processing apparatus such as, for example, a capacitively-coupled plasma processing apparatus or a plasma processing apparatus using microwaves. In addition, step S1 is not limited to the step of the exemplary embodiment illustrated in FIGS. 4 and 6. For example, step S1 may include only the plasma etching that uses a processing gas such as, for example, a fluorocarbon gas.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A method for processing a workpiece that includes a base layer, two raised regions provided on the base layer to be spaced apart from each other, a nitride region made of silicon nitride and including first sections covering the raised regions and a second section covering the base layer between the raised regions, and an oxide region made of silicon oxide and covering the nitride region, so as to form an opening that extends to the base layer through a portion between the raised regions, the method comprising:
    forming an opening in the oxide region to expose the second section between the raised regions; and
    etching a residue made of silicon oxide and existing within the opening and the second section, in which a denatured region is formed by exposing the workpiece to plasma of a mixed gas including a hydrogen-containing gas and $NF_3$ gas to denature the residue and the second section, and the denatured region is removed.

2. The method of claim 1, wherein the mixed gas includes $H_2$ gas and $NF_3$ gas.

3. The method of claim 1, wherein the etching the residue and the second section includes:
    forming the denatured region by exposing the workpiece to the plasma of the mixed gas, and removing the denatured region, the mixed gas including $NH_3$ gas and $NF_3$ gas; and
    forming the denatured region by exposing the workpiece to the plasma of the mixed gas and removing the denatured region, the mixed gas including $H_2$ gas and $NF_3$ gas.

4. The method of claim 1, wherein the denatured region is removed by heating the workpiece.

5. The method of claim 1, wherein the denatured region is removed by exposing the workpiece to secondary electrons emitted from an upper electrode of a capacitively-coupled plasma processing apparatus, the upper electrode being made of silicon and the secondary electrons being emitted from the upper electrode when the upper electrode is sputtered by positive ions.

6. The method of claim 1, wherein the forming the opening in the oxide region includes:
    forming a protective film on the nitride region and the oxide region, in which a protective film larger in thickness than a protective film formed on the oxide region is formed on the nitride region by exposing the workpiece to plasma of a fluorocarbon gas; and
    etching the oxide region, in which the workpiece is exposed to the plasma of the fluorocarbon gas,
    wherein a high-frequency bias power supplied, when forming the protective film, to a mounting table configured to mount the workpiece thereon is smaller than a high-frequency bias power supplied, when etching the oxide region, to the mounting table, and
    when forming the protective film, the workpiece is set at a temperature in a range of 60° C. to 250° C.

7. The method of claim 6, wherein, when forming the protective film, the high-frequency bias power is not supplied to the mounting table.

8. The method of claim 6, wherein, when forming the protective film, a gas including at least one of $C_4F_6$, $C_4F_8$, and $C_6F_6$ is used as the fluorocarbon gas.

9. The method of claim 6, wherein the forming the protective film and the etching the oxide region are alternately repeated.

10. The method of claim 1, wherein the forming the opening in the oxide region includes:
    exposing the workpiece to plasma of a processing gas including a fluorocarbon gas, in which the oxide region is etched and a deposition including fluorocarbon is formed on the oxide region; and
    etching the oxide region by radicals of the fluorocarbon included in the deposition,
    wherein the exposing the workpiece to the plasma of the processing gas including the fluorocarbon gas and the etching the oxide region by the radicals of the fluorocarbon are alternately repeated.

11. The method of claim 10, wherein, when etching the oxide region by the radicals of the fluorocarbon, the workpiece is exposed to plasma of a rare gas.

12. The method of claim 11, wherein, when etching the oxide region by the radicals of the fluorocarbon, the fluorocarbon gas is not supplied.

13. The method of claim 1, further comprising:
    forming an additional protective film on the first sections and the second section, between the forming the opening in the oxide region and the etching the residue and the second section.

14. The method of claim 13, wherein, when forming the additional protective film, the additional protective film including fluorocarbon is formed by executing a plasma processing of a fluorocarbon gas.

15. The method of claim 13, further comprising:
    executing an ashing process for removing an organic substance existing on the workpiece with the opening formed therein, wherein the forming the additional protective film is executed between the executing the ashing process and the etching the residue and the second section.

* * * * *